(12) United States Patent
Knotts et al.

(10) Patent No.: US 7,164,322 B1
(45) Date of Patent: Jan. 16, 2007

(54) ESTABLISHING A TUNING SIGNAL WINDOW FOR USE IN CENTERING A MULTI-BAND VOLTAGE CONTROLLED OSCILLATOR

(75) Inventors: Thomas Allen Knotts, Mountain View, CA (US); Gunter Willy Steinbach, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 53 days.

(21) Appl. No.: 11/186,059

(22) Filed: Jul. 21, 2005

(51) Int. Cl.
*H03L 7/08* (2006.01)
*H03L 7/099* (2006.01)

(52) U.S. Cl. .................. 331/1 A; 331/16; 331/17; 331/179

(58) Field of Classification Search ............... 331/1 A, 331/8, 16–18, 24, DIG. 2; 327/156–159; 332/127; 360/51; 375/376; 455/260
See application file for complete search history.

(56) References Cited

U.S. PATENT DOCUMENTS

| | | | |
|---|---|---|---|
| 6,133,797 A | 10/2000 | Lovelace et al. | |
| 6,545,545 B1 | 4/2003 | Fernandez-Texon | |
| 2002/0089383 A1 | 7/2002 | Su et al. | |
| 2005/0226357 A1* | 10/2005 | Yoshimura | 375/376 |

FOREIGN PATENT DOCUMENTS

EP 1220454 A2 7/2002

OTHER PUBLICATIONS

Dunning, Garcia, Lundberg, Nuckolls, An all-Digital Phase-Locked Loop with 50-Cycle Lock Time Suitable for High-Performance Microprocessors, IEEE Journal of Solid-State Circuits, vol. 30, No. 4, Apr. 1995, pp. 412-422.
Anand, Razavi, A 2.75 Gb/s CMOS Clock Recovery Circuit with Broad Capture Range, IEEE ISSCC 2001 Degest, p. 214.
Noguchi, Tateyama, Okamoto, Uchida, Kimura, and Takahashi, A 9.9G-10.8Gb/s Rate-Adaptive Clock and Data-Recovery with No External Reference Clock for WDM Optical Fiber Transmission, IEEE ISSCC 2002 Digest, p. 252.

* cited by examiner

*Primary Examiner*—David Mis

(57) ABSTRACT

A technique for establishing a tuning signal window for a multi-band VCO involves setting the tuning signal window to an initial size, preferably a relatively small size, and determining whether the VCO is churning. When the VCO is determined to be churning, the tuning signal window is expanded until the VCO stops churning. In an embodiment, the tuning signal window is expanded incrementally until the tuning signal window is large enough to include a solution, where a solution is defined as an operating point along a frequency band that satisfies both the setpoint frequency and tuning window signal requirements. The tuning signal window can be set at an offset relative to the tuning signal zero to compensate for shifts in the frequency bands that may result from changes in operating conditions.

35 Claims, 18 Drawing Sheets

ESTABLISHING A TUNING SIGNAL WINDOW FOR USE IN CENTERING A MULTI-BAND VOLTAGE CONTROLLED OSCILLATOR

CROSS-REFERENCE TO RELATED CASES

This application is related to the U.S. patent application entitled "Centering a multi-band voltage controlled oscillator," Ser. No. 10/775,960, filed Feb. 10, 2004, which is assigned to the assignee of the current application and incorporated by reference herein.

BACKGROUND OF THE INVENTION

Phase-locked loops (PLLs) are used in data communications and telecommunications applications to lock onto the frequency of an incoming signal. A typical PLL includes a voltage controlled oscillator (VCO) that is tuned to match the frequency of the incoming signal. One technique that is used to reduce the magnitude of the required tuning gain of a VCO and to reduce the corresponding noise sensitivity of the VCO while still providing a wide frequency range involves splitting the entire frequency tuning range of the VCO into multiple overlapping frequency bands. VCOs that are configured with multiple overlapping frequency bands are generally referred to as "multi-band VCOs." FIG. 1 depicts an example graph of VCO frequency vs. the VCO tuning signal voltage for multiple different frequency bands 90 of a multi-band VCO.

Controlling a multi-band VCO to lock onto a setpoint frequency involves "centering" the VCO by selecting a frequency band that includes the setpoint frequency. One technique for centering a multi-band VCO is described in the U.S. patent application entitled "Centering a multi-band voltage controlled oscillator," Ser. No. 10/775,960, filed Feb. 10, 2004, which is assigned to the assignee of the current application and incorporated by reference herein. The technique involves comparing a VCO tuning signal to a pre-established tuning signal window to determine whether to change the frequency band of the multi-band VCO. Using this technique, if the pre-established tuning signal window is set too narrow, there may not be a frequency band that intersects the setpoint frequency at a point that is within the tuning signal window. If there is no operating point that meets the setpoint frequency and tuning signal window requirements, then the VCO will begin to "churn" around the setpoint frequency. That is, the trajectory of the VCO frequency will continuously move back and forth across the tuning signal window and around the setpoint frequency without finding a solution, where a solution is defined as an operating point along a frequency band that satisfies both the setpoint frequency and tuning signal window requirements.

Churning can be prevented by simply setting the tuning signal window of a multi-band VCO so wide that there is always a solution. The problem with setting the tuning signal window so wide is that there will likely be more than one frequency band that intersects the setpoint frequency within the tuning signal window. When there are multiple intersecting frequency bands within the tuning signal window, there is no guarantee that the VCO will converge to the best solution.

The ideal tuning signal window for a multi-band VCO is a function of the setpoint frequency, the spacing of the frequency bands, and operating conditions of the PLL. One way to determine the ideal tuning signal window for a multi-band VCO is by carrying out simulations taking into account all process corners. A drawback to simulations is that they are a time consuming and expensive proposition. Further, the results of any simulations must be generalized to different sets of operating conditions.

SUMMARY OF THE INVENTION

A technique for establishing a tuning signal window for a multi-band VCO involves setting the tuning signal window to an initial size, preferably a relatively small size, and determining whether the VCO is churning. When the VCO is determined to be churning, the tuning signal window is expanded until the VCO stops churning. In an embodiment, the tuning signal window is expanded incrementally until the tuning signal window is large enough to include a solution, where a solution is defined as an operating point along a frequency band that satisfies both the setpoint frequency and tuning window signal requirements. Once a solution is found, the corresponding frequency band is fixed until the next band selection cycle is triggered. By expanding the tuning signal window until the VCO stops churning, the technique ensures that the tuning signal window is established at one of the smallest, if not the smallest, possible window sizes. Further, the window size is established automatically on a device-specific basis without the need for simulations.

In an embodiment, the tuning signal window is set at an offset relative to the tuning signal zero to compensate for shifts in the frequency bands that may result from changes in operating conditions. In the case of operating conditions that include an initially low temperature and high power supply, the tuning signal window is ideally offset to a negative tuning signal (e.g., shifted to the left of center) so as to increase the amount the frequency bands can shift down due to increased temperature or decreased power supply before the target frequency can no longer be reached using the selected frequency band. In the case of operating conditions that include an initially high temperature and low power supply, the tuning signal window is ideally offset to a positive tuning signal (e.g., shifted to the right of center) so as to increase the amount the frequency bands can shift up due to decreased temperature or increased power supply before the target frequency can no longer be reached using the selected frequency band.

Other aspects and advantages of the present invention will become apparent from the following detailed description, taken in conjunction with the accompanying drawings, illustrated by way of example of the principles of the invention.

BRIEF DESCRIPTION OF THE DRAWINGS

Throughout the description similar reference numbers are used to identify similar elements.

DETAILED DESCRIPTION

The task of a PLL is to lock the phase and frequency of a VCO signal to a particular signal, referred to herein as an input signal. PLLs with multi-band VCOs should be switched to a frequency band with a center frequency that is near the setpoint frequency of the VCO. One way to center a multi-band VCO involves comparing a VCO tuning signal to a pre-established tuning signal window. In accordance with the invention, the size of the tuning signal window is established by setting the tuning signal window to an initial size, preferably a relatively small size, and determining whether the VCO churns with the tuning signal window set at the initial size. When the VCO churns with the tuning signal window set to the initial size, the tuning signal window is expanded until the VCO stops churning. In an embodiment, the tuning signal window is initially set at an offset relative to the tuning signal zero to compensate for shifts in the frequency bands that may result from changes in operating conditions.

Figure 2:
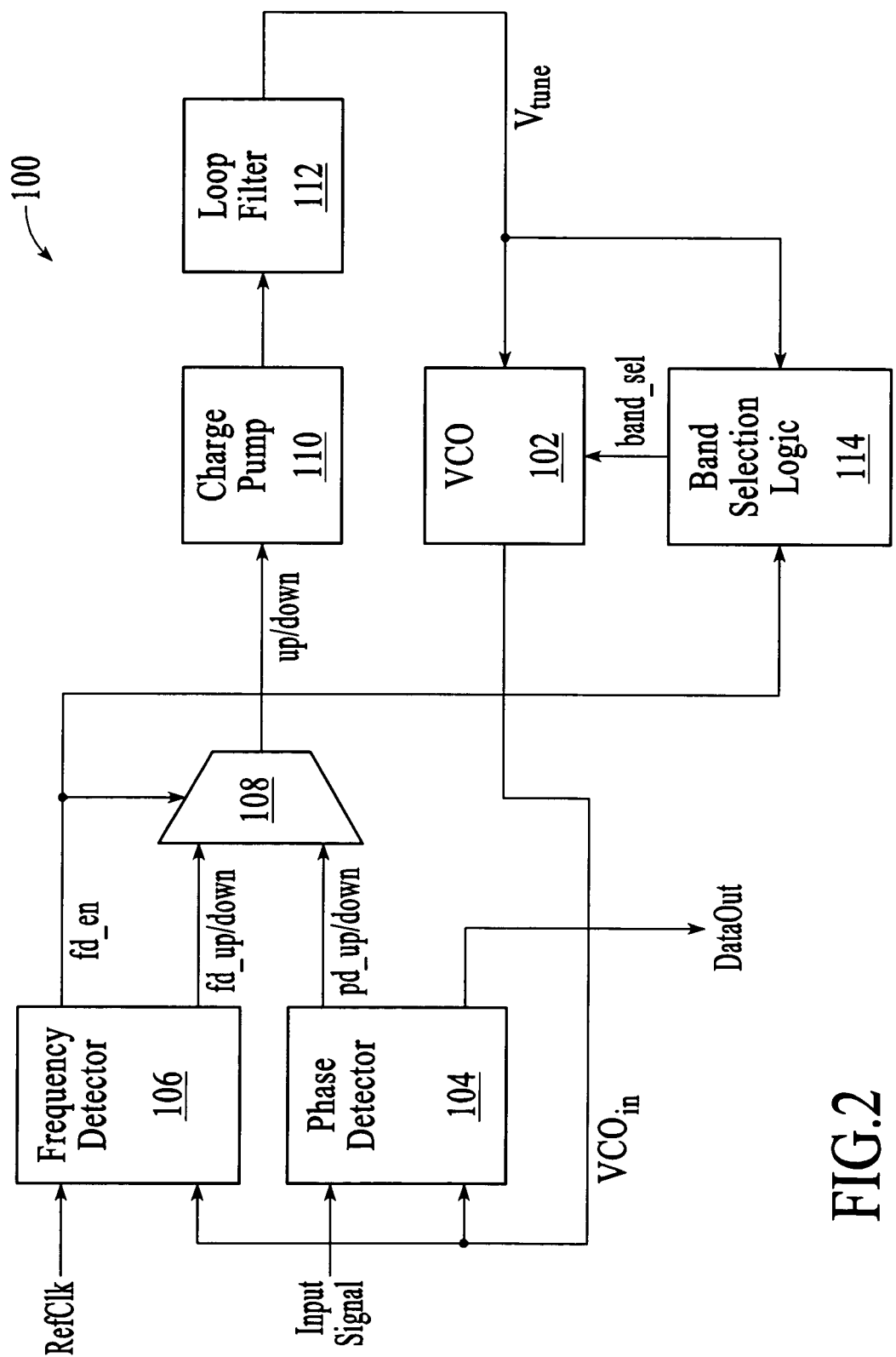
FIG. 2 depicts a PLL that includes band selection logic that is responsive to a control signal from a frequency detector and a VCO tuning signal from a loop filter.

FIG. 2 depicts an embodiment of a phase-locked loop (PLL) 100 that includes a voltage controlled oscillator (VCO) 102, a phase detector 104, a frequency detector 106, a multiplexer 108, a charge pump 110, a loop filter 1112, and band selection logic 114. The phase detector is connected to receive an input signal from a signal source and a portion of the VCO signal ($VCO_{in}$) from the VCO. The input signal carries clock information and data that is to be recovered. As part of the PLL operation, the phase detector compares transitions of the input signal with transitions of the VCO signal and generates an output (referred to herein as the "pd_up/down" signal) that indicates the phase difference between the input signal and the VCO signal. The phase detector produces an "up" signal when the phase of the input signal leads the phase of the VCO signal and a "down" signal when the phase of the input signal lags the phase of the VCO signal. An up signal is used to drive the frequency of the VCO upward while a down signal is used to drive the frequency of the VCO signal downward, thereby advancing or retarding, respectively, the phase of the VCO signal. The phase detector also outputs the recovered data (DataOut). This data is not critical to the invention and is not described further. In the example of FIG. 2, the phase detector can be a digital phase detector or a linear phase detector.

The frequency detector 106 is connected to receive a portion of the VCO signal ($VCO_{in}$) from the VCO 102 and a reference clock signal (RefClk) from a reference clock source (often external to the system and not shown here). The frequency detector uses the reference clock signal to determine whether the VCO signal should be controlled by the frequency detector. The frequency detector controls the VCO when the frequency of the VCO signal is outside a pre-established deadband region that is centered at a setpoint frequency of the VCO. The frequency detector generates a control signal (referred to herein as the "fd_en" signal) that indicates whether the VCO is to be controlled by the frequency detector or the phase detector 104 (that is, whether control of the VCO by the frequency detector is enabled or disabled). When the frequency detector does not control the VCO because the frequency of the VCO is within the deadband region, the system is said to be in "lock." When the frequency detector does control the VCO because the frequency of the VCO is outside the deadband region, the system is said to be out of lock. The frequency detector also generates an output (referred to herein as the "fd_up/down" signal) that indicates the sign of the frequency difference between the frequency of the VCO signal and the setpoint frequency. In the embodiment of FIG. 2, when the control signal (fd_en) is "high" (e.g., fd_en is high), the output (fd_up/down) from the frequency detector controls the VCO. Conversely, when the control signal (fd_en) is "low" (e.g., fd_en is low), the output (pd_up/down) from the phase detector controls the VCO. The portion of the VCO signal that is received at the frequency detector and the phase detector may be divided by N using a signal divider (not shown). In an alternative embodiment, the function of the frequency detector can be performed by a more general "lock detector," which determines whether control of the VCO should be given up to the phase detector. Instead of basing the control decision on the frequency difference between the actual frequency of the VCO and a setpoint frequency (as is the case with the frequency detector), the lock detector may use other criteria, such as bit errors or consistency of phase, to determine if/when control of the VCO should be given up to the phase detector. Even if lock detection is not based on a frequency measurement, there is still a need for a frequency detector that generates a signal representing the sign of the frequency difference between the VCO signal and a reference signal.

The multiplexer 108 receives the control signal (fd_en) from the frequency detector 106 and allows the corresponding control signal (either fd_up/down from the frequency detector or pd_up/down from the phase detector 104) to control the charge pump 110. The charge pump receives an "up/down" signal from the multiplexer and transfers a positive charging current to the loop filter 112 if the up/down signal is "up" or a negative charging current if the up/down signal is "down." The loop filter generates a VCO tuning signal (referred to in the figures as $V_{tune}$) in response to an output from the charge pump. In general, when a positive charging current is received from the charge pump, the tuning voltage output from the loop filter is increased, thereby causing the frequency of the VCO 102 to increase. Conversely, when a negative charging current is received from the charge pump, the tuning voltage output from the loop filter is decreased, thereby causing the frequency of the VCO to decrease.

The band selection logic 114 is connected to receive the control signal (fd_en) from the frequency detector 106 and the VCO tuning signal ($V_{tune}$) from the loop filter 112. The band selection logic outputs a band selection signal (identified in FIG. 2 as the "band_sel" signal) in response to the control signal (fd_en) and the VCO tuning signal ($V_{tune}$). The band selection signal (band_sel) determines the frequency band in which the multi-band VCO 102 operates.

Operation of the PLL 100 depicted in FIG. 2 involves tuning the VCO 102 in response to continuous feedback from the phase detector 104, the frequency detector 106, and the band selection logic 114. Starting at the VCO for description purposes, the VCO receives the VCO tuning signal ($V_{tune}$) from the loop filter 112 and produces a VCO signal as an output. A portion of the VCO signal ($VCO_{in}$) is fed to the phase detector and the frequency detector. The phase detector and the frequency detector generate output signals (pd_up/down, fd_en, and fd_up/down) in response to the VCO signal ($VCO_{in}$). The output signal from one of the phase detector and the frequency detector is selected by the multiplexer 108 in response to the control signal (fd_en). The output (up/down) from the multiplexer is used to adjust the VCO control signal ($V_{tune}$) and as a result the frequency of the VCO. Additionally, the band selection logic operates, in response to the control signal (fd_en) from the frequency detector and the VCO tuning signal ($V_{tune}$) from the loop filter, to control the frequency band in which the VCO operates.

Figure 1:
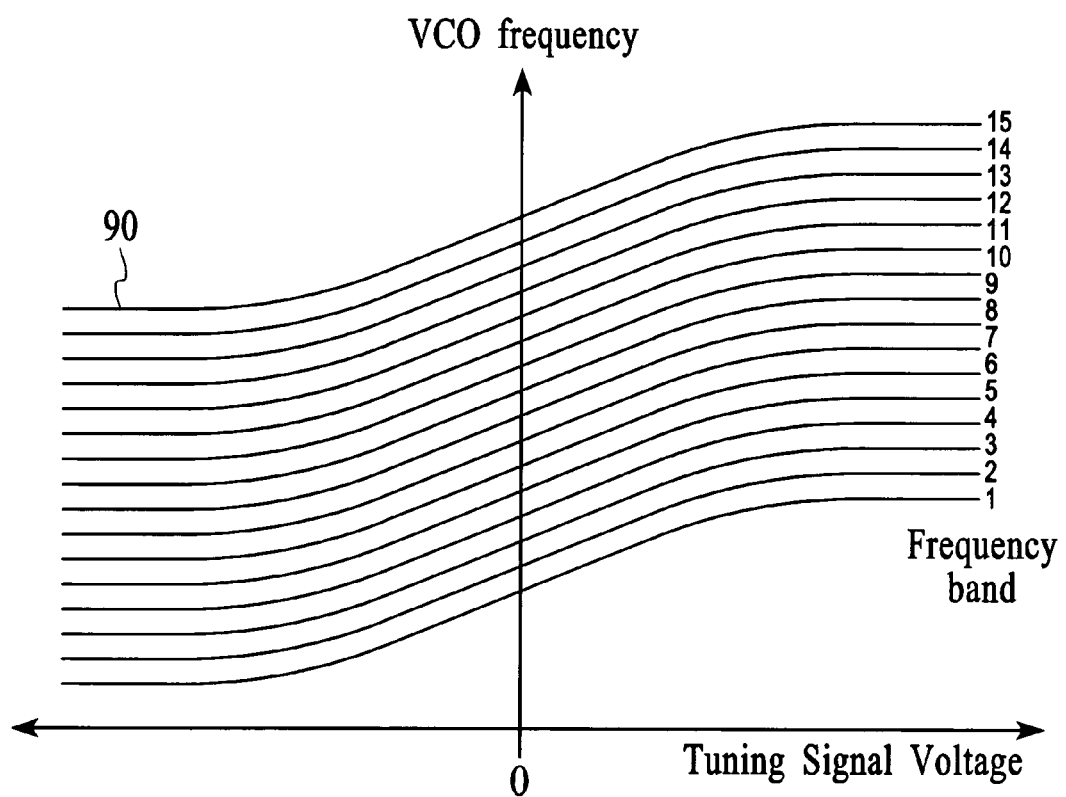
FIG. 1 depicts an example graph of VCO frequency vs. the VCO tuning signal voltage for multiple different frequency bands of a multi-band VCO.
Figure 3:
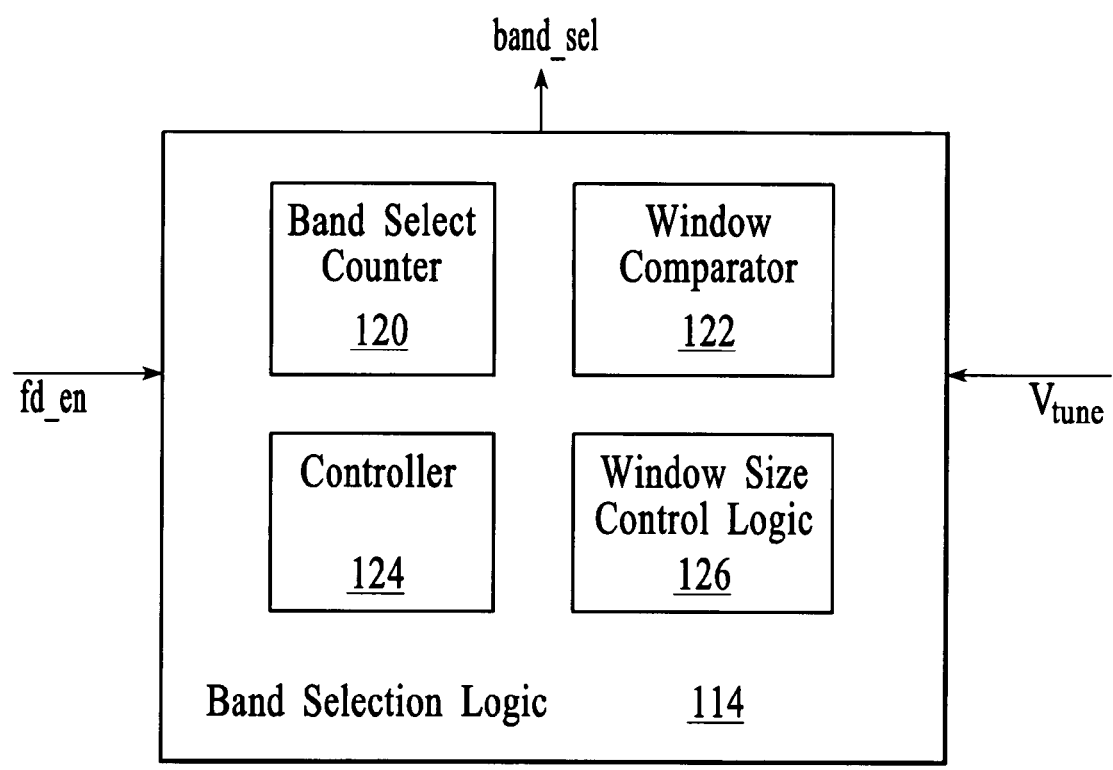
FIG. 3 depicts an expanded view of the band selection logic from FIG. 2 that includes a band select counter, a window comparator, a controller, and window size control logic.

The invention relates to the band selection logic 114 and band selection techniques that can be implemented using the band selection logic. FIG. 3 depicts an embodiment of the band selection logic that includes a band select counter 120, a window comparator 122, a controller 124, and window size control logic 126. As described above, the band selection logic receives the VCO tuning signal ($V_{tune}$) from the loop filter 112 (FIG. 2) and the control signal (fd_en) from the frequency detector 106 (FIG. 2) and in response outputs the band selection signal (band_sel) that indicates the frequency band in which the VCO should operate. In the embodiment of FIG. 3, the band select counter is a digital counter whose counter value corresponds to a frequency band of the VCO. For example, a 4-bit binary counter can be used to individually identify (e.g., via the band_sel signal) each band of a multi-band VCO that has sixteen different frequency bands 90 as depicted in FIG. 1. The band select counter can be a saturating up/down counter that does not roll over when it reaches all zeroes or all ones.

To help the VCO converge to the setpoint frequency, the band select counter, and, hence, the frequency band of the VCO are allowed to change only when two requirements are met. The first requirement is met when the VCO tuning signal ($V_{tune}$) is outside a pre-established tuning signal window. The establishment of the tuning signal window for use in selecting the frequency band of the VCO is the focus of the invention and is described below. The second requirement is met when one of two conditions is satisfied. Specifically, the second requirement is met when the frequency detector is controlling the VCO. For example, the second requirement is met when fd_en is high. Alternatively, the second requirement is met when the band select counter has changed by less than a predefined number, N, after the frequency detector gives up control of the VCO. For example, if N is set equal to one, then the band select counter is allowed to change by one (i.e., either to increase or decrease by one) after the frequency detector 106 has given up control of the VCO 102 provided that the first requirement is also met (i.e., the VCO tuning signal ($V_{tune}$) is outside the tuning signal window). The controller 124 determines whether the second requirement is met. In an embodiment, the band select counter is incremented when the VCO tuning signal ($V_{tune}$) is above an upper boundary of the tuning signal window and is decremented when the VCO tuning signal ($V_{tune}$) is below a lower boundary of the tuning signal window. This technique for centering a multi-band VCO is described in more detail in the above-referenced patent application.

Figure 4:
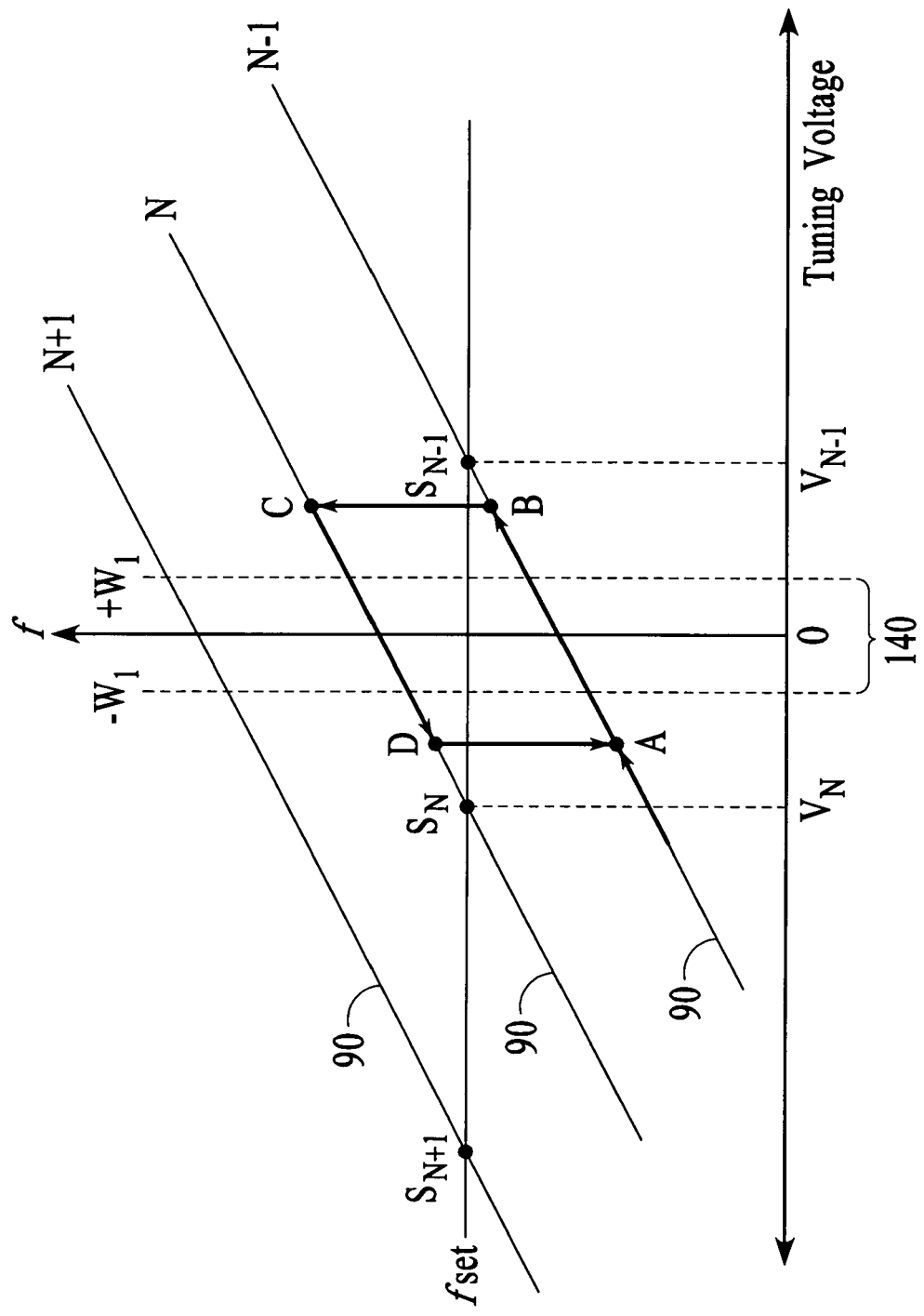
FIG. 4 is an expanded view of a portion of the VCO frequency vs. tuning signal voltage graph from FIG. 1 that illustrates the problem of churning.

To better facilitate the description of the invention, the problem of churning will be described with reference to FIG. 4, which is an expanded view of a portion of the VCO frequency vs. tuning signal voltage graph from FIG. 1. The VCO frequency vs. tuning signal voltage graph of FIG. 4 includes three frequency bands (N+1, N, and N−1) that intersect a setpoint frequency ($f_{set}$). The graph also depicts a pre-established tuning signal window 140 defined by the window boundaries ±$W_1$. As depicted in FIG. 4, none of the three frequency bands intersect the setpoint frequency at a point that is within the tuning signal window. The closest two solutions to the tuning signal window, solutions $S_N$ and $S_{N-1}$, have tuning voltages of $V_N$ and $V_{N-1}$, respectively, both of which are outside of the tuning signal window.

Given the combination of tuning signal window and frequency bands 90 depicted in FIG. 4, the trajectory of the VCO frequency may initially travel along frequency band N−1 to point A. At point A, since the frequency is below the setpoint frequency, the VCO frequency is increased along frequency band N−1. The VCO frequency will continue along frequency band N−1 until it reaches the setpoint frequency at point $S_{N-1}$ or until a specific amount of time has passed. In this case, the VCO frequency increases along frequency band N−1 to point B, the point at which the designated number of measurement cycles has passed. At point B, since the VCO frequency is still below the setpoint frequency and the tuning signal is outside the tuning signal window 140, the frequency band is incremented by one band. Upon incrementing the frequency band, the VCO frequency jumps up to point C such that the VCO frequency is now above the setpoint frequency. Because the VCO frequency is now above the setpoint frequency, the VCO frequency is driven down along frequency band N. The VCO frequency continues along frequency band N until it reaches the setpoint frequency at point $S_N$ or until the designated number of measurement cycles have passed. In this case, the VCO frequency decreases along frequency band N to point D, the point at which the designated number of measurement cycles have passed. At point D, since the VCO frequency is still above the setpoint frequency and the tuning signal is outside the tuning signal window, the frequency band is decremented by one band. Upon decrementing the frequency band, the VCO frequency drops down to point A, or near point A, such that the VCO frequency is again below the setpoint frequency. From point A, the above-described process repeats such that the trajectory of the VCO frequency continuously churns back and forth across the tuning signal window and around the setpoint frequency.

In accordance with the invention, a technique for establishing the tuning signal window 140 involves setting the tuning signal window to an initial size, preferably a relatively small size, and detecting whether the VCO churns with the tuning signal window set at the initial size. If the VCO churns with the tuning signal window set to the initial size, the tuning signal window is expanded until the VCO stops churning. In an embodiment, the tuning signal window is expanded incrementally until the tuning signal window is large enough to include a solution, where a solution is defined as an operating point that satisfies both the setpoint frequency and tuning window signal conditions. Once a solution is found, the corresponding frequency band is fixed until the next band selection cycle is triggered. By expanding the tuning signal window until the VCO stops churning, the technique ensures that the tuning signal window is established at one of the smallest, if not the smallest, possible window sizes. Further, the window size is established automatically on a device-specific basis without the need for simulations.

Figure 5:
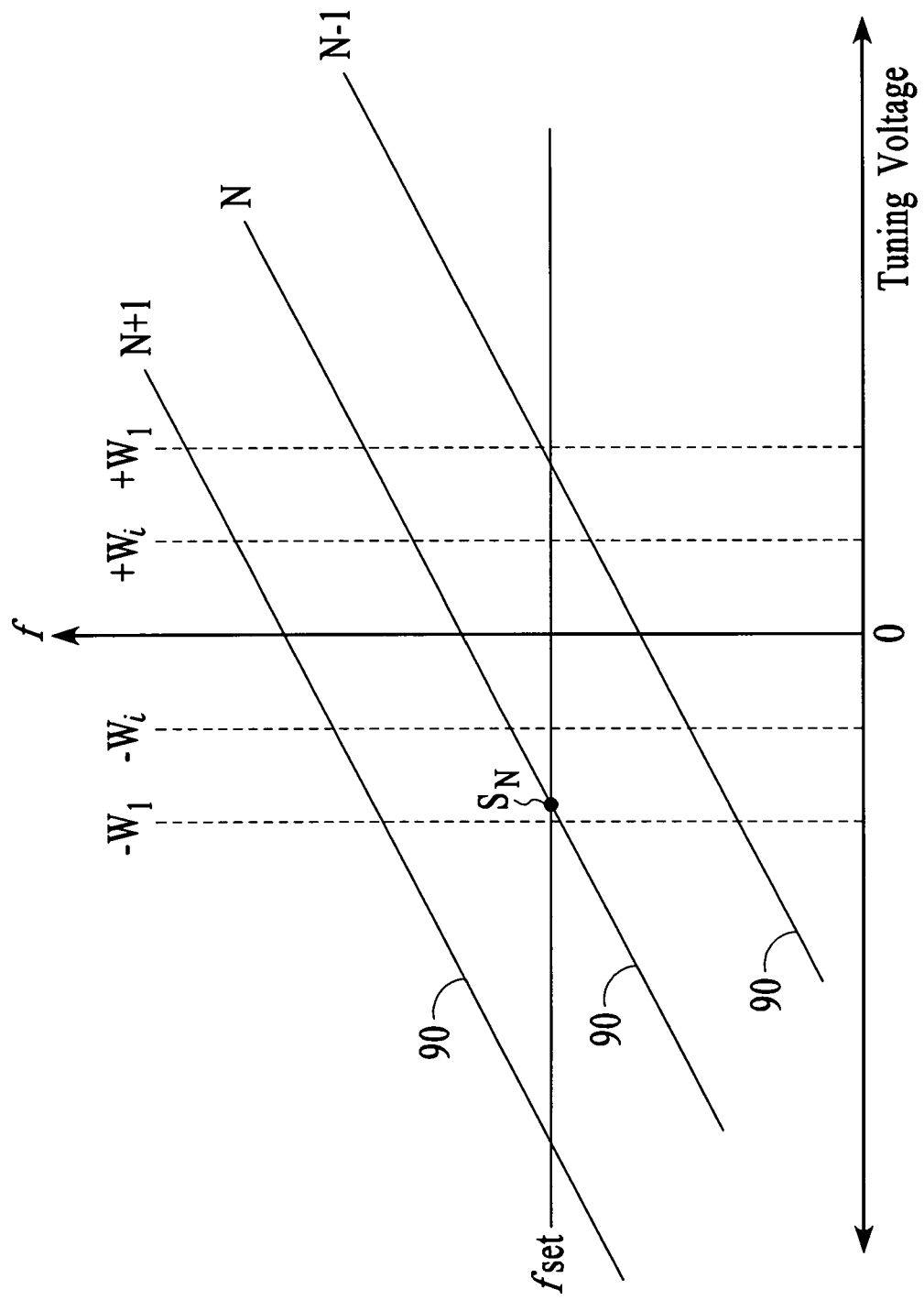
FIG. 5 is an expanded view of a portion of the VCO frequency vs. tuning signal voltage graph from FIG. 1 that illustrates the expansion of the tuning signal window to include a solution.

FIG. 5 is an expanded view of the VCO frequency vs. tuning signal voltage graph from FIG. 1 that illustrates the expansion of the tuning signal window to include a solution in accordance with the invention. In the example of FIG. 5, the tuning signal window is initially set to a value that is defined by the boundaries $\pm W_i$. With the tuning signal window established at this initial size, there is no solution that meets the setpoint frequency and tuning signal window conditions and therefore the VCO will churn as described with reference to FIG. 4. In accordance with the invention, the tuning signal window is expanded until the VCO stops churning. In an embodiment, the tuning signal window is expanded in equal size increments about the center (i.e., at zero tuning voltage) until the VCO stops churning. In the example of FIG. 5, the tuning signal window is expanded from $\pm W_i$ to $\pm W_1$ in a first incremental expansion. After the tuning signal window is expanded, a solution, $S_N$, is incorporated into the tuning signal window. Because a solution now exists within the tuning signal window, the VCO frequency will eventually converge to the solution, $S_N$. Once the VCO frequency converges to the solution, $S_N$, the VCO will stop churning and the tuning signal window will not be expanded any further. Although in this example, the tuning signal window is expanded in equal size increments about the center of the graph, the tuning signal window can be expanded in other ways.

As can be seen from the example of FIG. 5, the size of the expansion increment (i.e., the resolution) used to expand the tuning signal window affects the number of iterations required to reach a tuning signal window size that incorporates a solution. The size of the expansion increment also affects the number of possible solutions that are incorporated into the tuning signal window with each incremental expansion. If the expansion increment is relatively small, it may take more iterations for a solution to be incorporated into the tuning signal window but it is more likely that only one solution, which represents the smallest possible tuning signal voltage, will be incorporated into the tuning signal window upon any one expansion. Relatively small expansion increments will make it highly likely that the solution with the smallest possible tuning signal voltage will be found. On the other hand, if the expansion increments are relatively large, it will take fewer iterations to incorporate a solution into the tuning signal window but it is more likely that multiple solutions, including solutions with higher tuning signal voltages, will be incorporated into the tuning signal window upon any one expansion. With more than one solution incorporated within the tuning signal window, there is no guarantee that the PLL will converge to the solution with the smallest tuning signal voltage.

Referring back to FIG. 3, the comparison between the VCO tuning signal and the tuning signal window is accomplished by the window comparator 122. In an embodiment, the window comparator is configured such that the size of the tuning signal window is digitally controllable. In an embodiment, the window comparator includes a digital-to-analog converter (DAC) that converts a digital window size control signal to an analog control signal.

Figure 6:
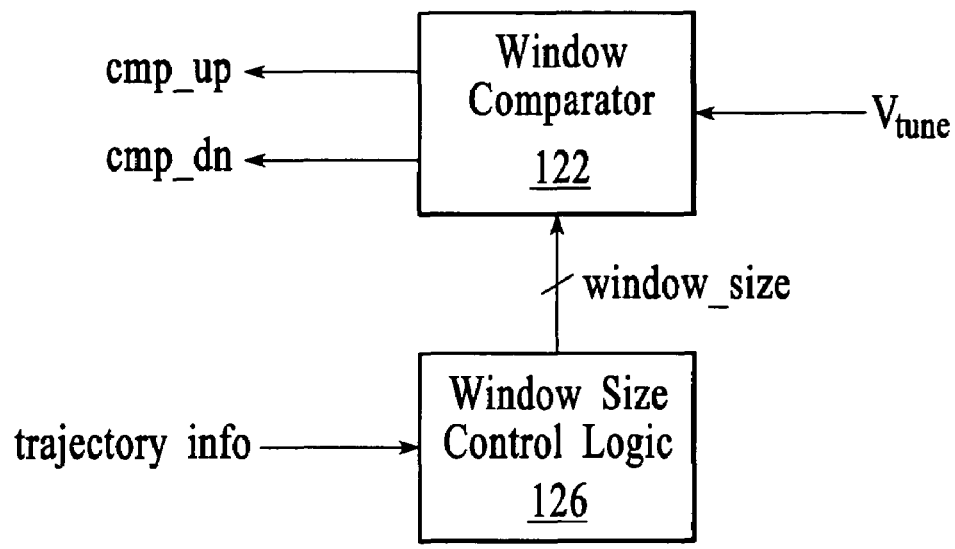
FIG. 6 is a functional depiction of the window comparator and the window size control logic from FIG. 3.

The size of the tuning signal window to which the VCO tuning signal ($V_{tune}$) is compared is controlled as described above by the window size control logic 126. FIG. 6 is a functional depiction of the window comparator 122 and the window size control logic from FIG. 3. As depicted in FIG. 6, the window size control logic receives trajectory information related to the VCO frequency and outputs a window size control signal (window_size) in response. The window size control signal establishes the size of the tuning signal window that is compared to the VCO tuning signal ($V_{tune}$) by the window comparator. In the embodiment of FIG. 6, the window size control signal is a digital signal. The window comparator outputs an indication of the magnitude of the VCO tuning signal ($V_{tune}$) relative to the tuning signal window (e.g., cmp_up and cmp_dn, which indicate whether $V_{tune}$ is above/within/below the tuning signal window) and the indication is used in the frequency band selection. In this embodiment, the trajectory information that is used to establish the window size includes the output from the window comparator and the frequency detector control signal (fd_en).

Figure 7:
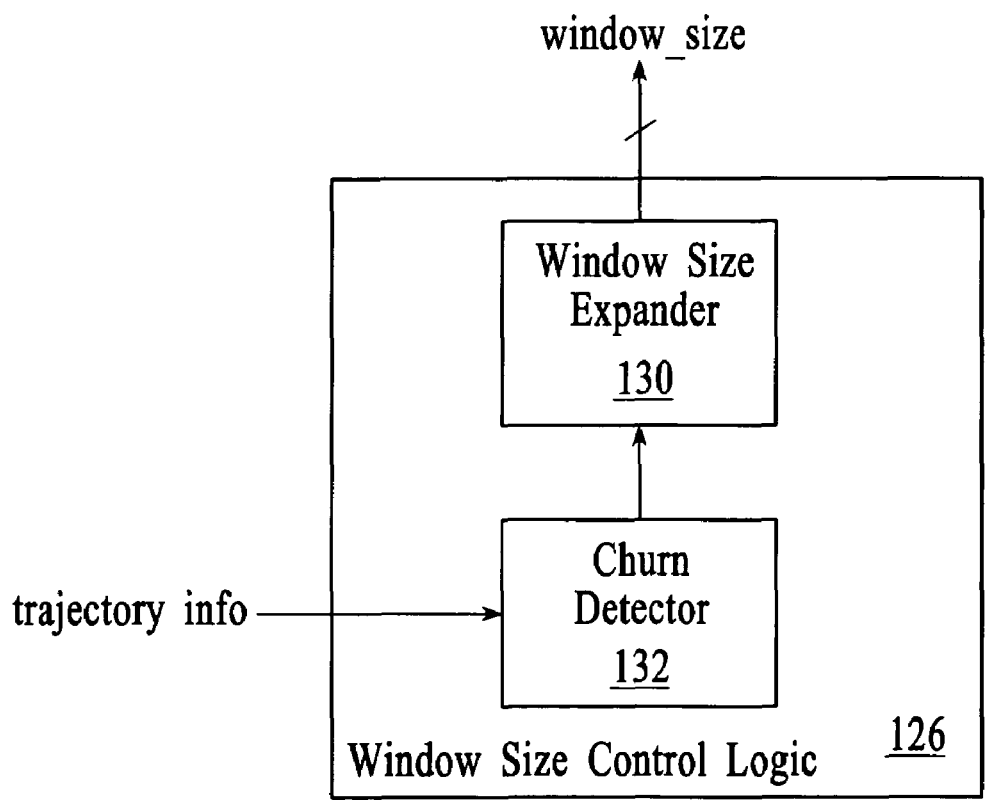
FIG. 7 depicts an embodiment of the window size control logic from FIG. 6 that includes a churn detector and a window size expander.

FIG. 7 depicts an embodiment of the window size control logic 126 from FIG. 6 that includes a churn detector 132 and a window size expander 130. The churn detector uses trajectory information to determine whether the VCO is churning and the window size expander generates the window size control signal (window_size) which establishes the size of the tuning signal window.

Figure 8:
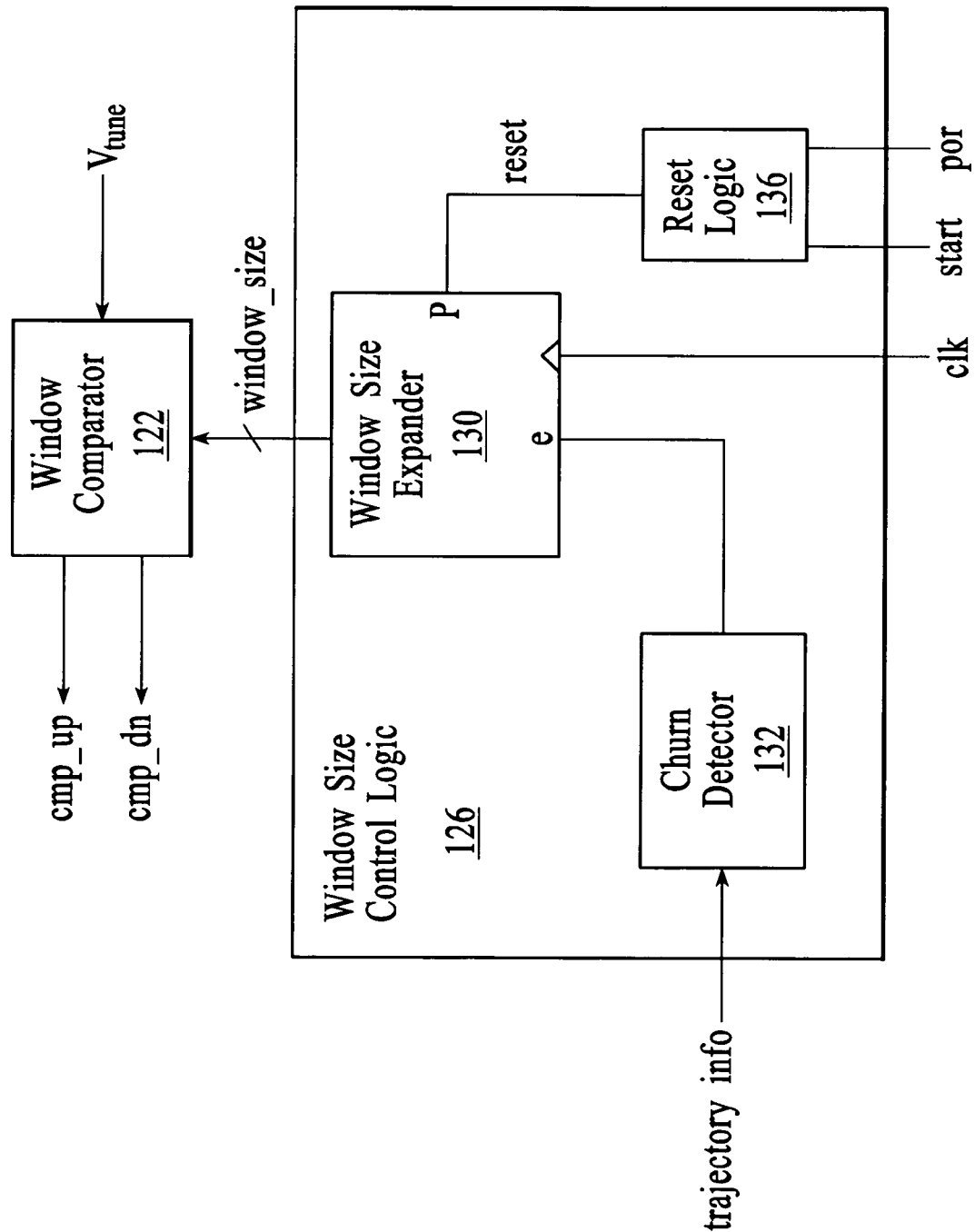
FIG. 8 is a depiction of the window size control logic from FIG. 7 that includes optional reset logic and that illustrates some functional relationships between the churn detector, the window size expander, and the reset logic.

FIG. 8 is a depiction of an embodiment of the window size control logic 126 from FIG. 7 that includes optional reset logic 136 and that illustrates some functional relationships between the churn detector 132, the window size expander 130, and the reset logic. In operation, the churn detector receives trajectory information and uses the trajectory information to determine whether the VCO is churning. Different techniques can be used to determine whether the VCO is churning. According to one technique, the churn detector counts the number of frequency band changes to determine if the VCO is churning. For example, in a simple case, the VCO is determined to be churning after a pre-established number of frequency band changes occur. Because there are a number of trajectories that the VCO frequency can take while churning, the number of frequency band changes may not be a consistent indication of churning. In another embodiment, churning is determined by tracking the number of window crossings made by the VCO frequency, where a window crossing occurs when the tuning signal voltage travels entirely across the tuning signal window. The VCO is assumed to be churning after a certain number of window crossings. The number of window crossings that need to occur to indicate churning is implementation specific but should be greater than one window crossing. In an embodiment, the churn detector is configured to determine that the VCO is churning after four window crossings occur. Once the churn detector determines that the VCO is churning, the churn detector outputs a churning indicator signal to the window size expander. For example, as indicated in FIG. 8, the churning indicator signal is provided to the window size expander as an enable signal (e).

The window size expander 130 receives the enable signal from the churn detector 132 and generates a window size control signal (window_size) that causes the tuning signal window to be expanded. Different techniques can be used to generate a window size control signal that causes the tuning signal window to be expanded. In an embodiment in which the window size control signal is a digital signal, the window size expander includes a digital counter that is incremented to indicate an increase in the size of the tuning signal window. For example, a window size counter is incremented by one count each time the enable signal is received from the churn detector. As described above, the window size control logic 126 will cause the tuning signal window to expand until the tuning signal window includes at least one solution. Once the tuning signal window includes at least one solution, the VCO will stop churning and the tuning signal window will not be expanded further.

Although the tuning signal window is described as having an initial window size of $\pm W_i$, the preferred initial window size is implementation specific. For example, in one embodiment, the initial window size is zero (or a window size that is so small that it is unlikely to include a solution). With the initial window size set to zero, the VCO will begin churning, thereby triggering the window expansion process.

The size of the tuning signal window is a function of the setpoint frequency and the spacing of the frequency bands. Under different operating conditions and/or parameters, the tuning signal window may need to be determined anew after it has been expanded as described above. In one embodiment, to determine anew the tuning signal window, the window size expander 130 includes a reset input that presets the size of the tuning signal window to the initial size (i.e., a preset value, P) upon a reset event. Reset events are triggered, for example, when the VCO goes out of lock or when the system is powered up. Referring to FIG. 8, the reset logic 136 includes a 'start' signal and a power-on-reset (por) signal. The start signal is asserted when the PLL loses frequency lock and goes into frequency acquisition mode. The 'por' signal is asserted upon a system reset, such as a system power up. In the embodiment of FIG. 8, the reset logic can be an OR gate that outputs the reset signal in response to either the start signal or the por signal.

Figure 9:
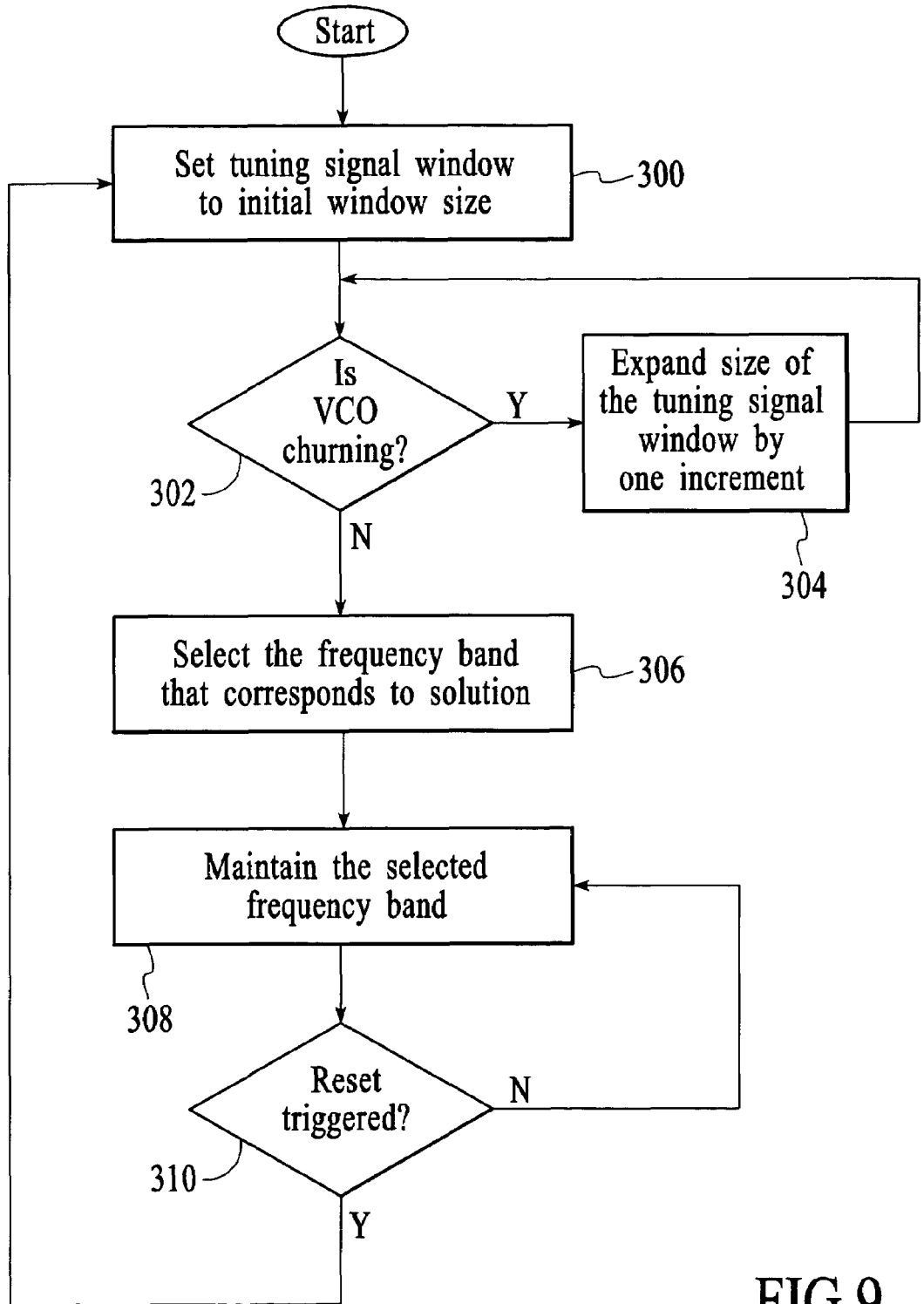
FIG. 9 depicts a flow diagram of a technique for establishing a tuning signal window for use in centering a multi-band VCO.

FIG. 9 depicts a flow diagram of the above-described technique for establishing a tuning signal window for use in centering a multi-band VCO. At block 300, the tuning signal window is set to an initial window size. At decision point 302, it is determined whether the VCO is churning. When the VCO is churning, at block 304, the window size is expanded by one increment. For example, a count which indicates the window size is incremented by one to trigger expansion of the tuning signal window by one increment. After the tuning signal window is expanded by the one increment, the process returns to decision point 302. The cycle of determining whether the VCO is churning and expanding the size of the tuning signal window when the VCO is churning continues until it is determined that the VCO has stopped churning. Once it is determined that the VCO has stopped churning (e.g., because the VCO has converged to a solution), the frequency band that corresponds to the solution is selected (block 306). The selected frequency band is maintained (block 308) until a reset is triggered as indicated by decision point 310. A reset is triggered, for example, when the PLL goes out of frequency lock or upon a system power up. Upon a reset, the process returns to block 300, at which point the tuning signal window is set back to the initial window size.

In the exemplary operation described with reference to FIG. 5, a solution is incorporated into the tuning signal window after only one incremental expansion of the tuning signal window. As indicated by the process flow diagram of FIG. 9, it may take more than one incremental expansion of the tuning signal window before a solution is incorporated into the tuning signal window.

Figure 10:
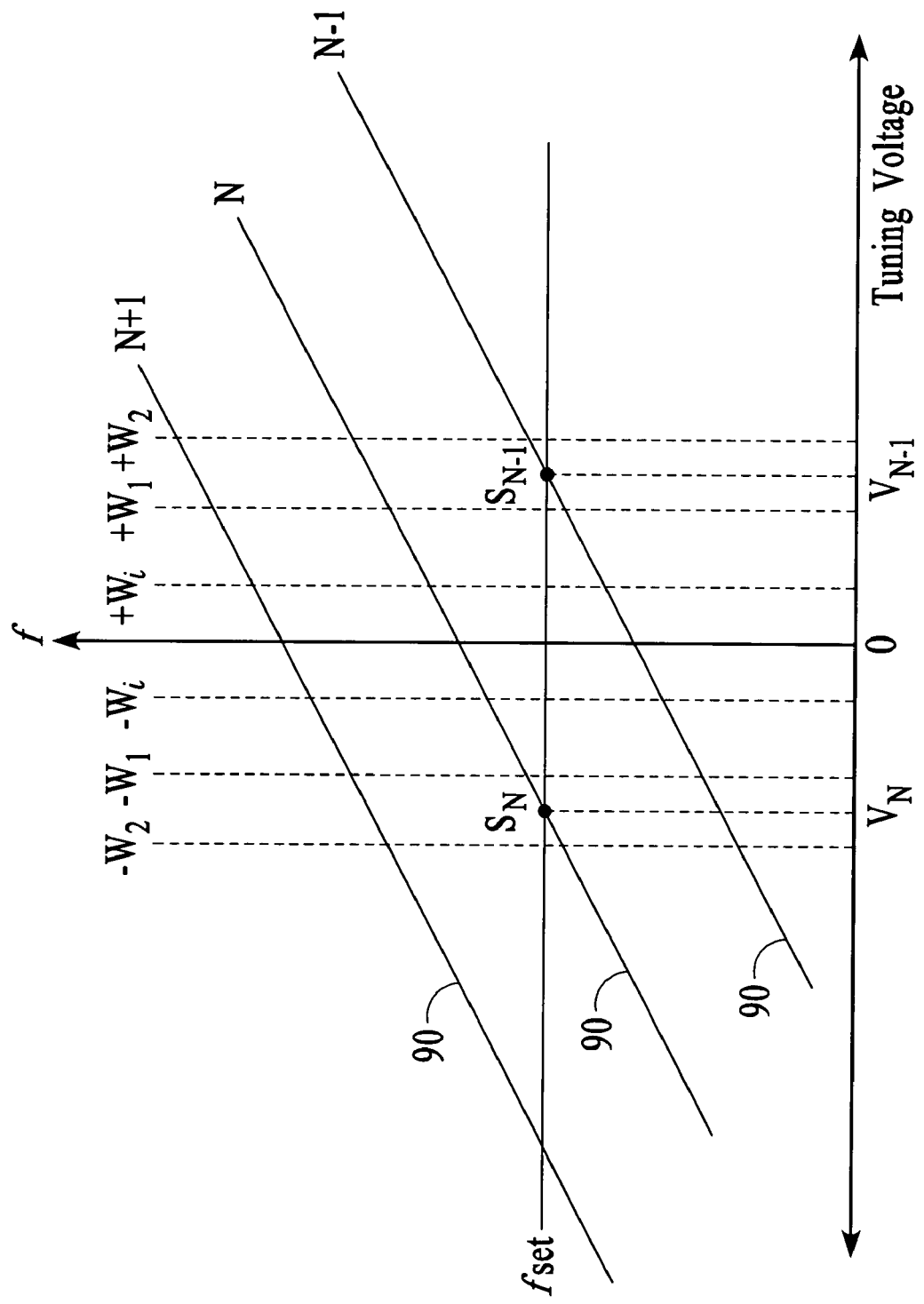
FIG. 10 depicts another expanded view of a portion of the VCO frequency vs. tuning signal voltage graph from FIG. 1 that illustrates the tuning signal window being expanded by two increments before a solution is incorporated into the tuning signal window.

FIG. 10 depicts another expanded view of a portion of the VCO frequency vs. tuning signal voltage graph from FIG. 1 that illustrates the tuning signal window being expanded by two increments before a solution is incorporated into the tuning signal window. Specifically, the tuning signal window is expanded by a first increment from $\pm W_i$ to $\pm W_1$, but no solution is incorporated into the tuning signal window as a result of the first incremental expansion. The tuning signal window is then expanded by a second increment from $\pm W_1$ to $\pm W_2$. A solution is incorporated into the tuning signal window as a result of the second incremental expansion. In fact, the expanded tuning signal window includes two solutions, solution $S_N$ with a tuning signal voltage of $V_N$ and solution $S_{N-1}$ with a tuning signal voltage of $V_{N-1}$. Once the tuning signal window is expanded to $\pm W_2$, the VCO will converge to one of the two solutions. Ideally, the VCO will converge to the solution with the smallest tuning signal voltage although the VCO may converge to either of the two solutions. Even though there is more than one solution incorporated into the tuning signal window, the difference between the magnitudes of the tuning signals of the two solutions is limited by the size of the incremental expansion. Hence, if the size of each incremental expansion is relatively large, the difference between the tuning signals of the two solutions can be relatively large and if the size of each incremental window expansion is relatively small, the difference between the tuning signals will be relatively small. The size of the incremental expansions of the tuning signal window can be set to balance resolution vs. the number of iterations required to reach a solution.

Figure 11:
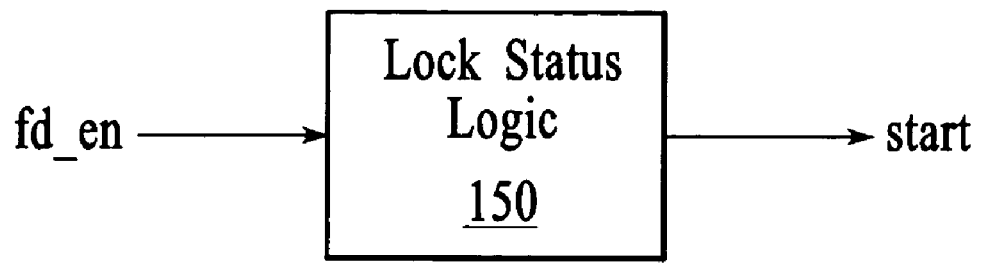
FIG. 11 is a block diagram of lock status logic that is configured to monitor a frequency detector control signal and to generate a 'start' signal when a PLL goes out of lock.

As described above, the size of the tuning signal window is reset back to an initial size when the PLL goes out of frequency lock. There are many techniques that can be used to determine if the PLL has gone out of frequency lock. In one embodiment, the control signal (fd_en) from the frequency detector is monitored to determine if the PLL has gone out of lock. As described above with reference to FIG. 2, the control signal (fd_en) goes to 1 (i.e., high) whenever a frequency error is detected during a measurement cycle (i.e., when the VCO frequency goes outside of a pre-established deadband region around the setpoint frequency). During the frequency lock process, the status of the control signal (fd_en) may change many times before a solution is finally found and the VCO frequency locks onto the input signal. Once the PLL achieves frequency lock, the control signal (fd_en) returns to zero (i.e., low) and remains zero until frequency lock is lost again. Therefore, a string of successive zeroes indicates that the PLL is in frequency lock. The next time the control signal (fd_en) goes to 1 after a successive string of zeroes, the PLL is assumed to be out of frequency lock and the tuning signal window is reset to the initial size ($\pm W_i$). FIG. 11 is a block diagram of lock status logic 150 that is configured to monitor the frequency detector control signal (fd_en) and to generate a 'start' signal when the PLL goes out of frequency lock. The start signal can be used as depicted in FIG. 8 to trigger a reset of the window size expander 130. This reset logic could be incorporated into the frequency detector 106 although this is not critical.

Figure 12:
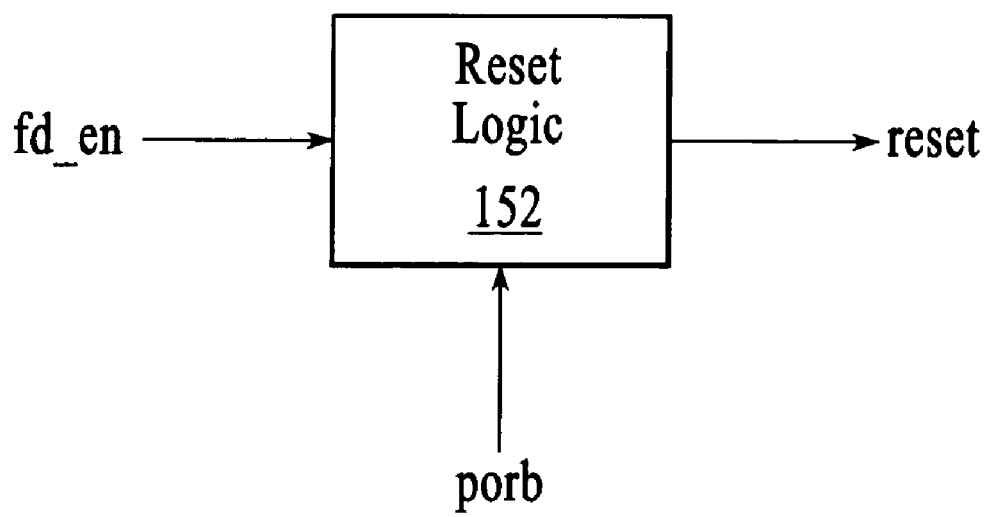
FIG. 12 depicts an embodiment of reset logic.

In an alternative embodiment as depicted in FIG. 12, the reset logic 152 can be configured to output the reset signal in response to the control signal (fd_en) and the power-on-reset (por) signal. In this embodiment, the reset logic asserts the reset signal either when the control signal (fd_en) indicates a loss of lock as described above or when the por signal indicates a system power up.

Figure 13:
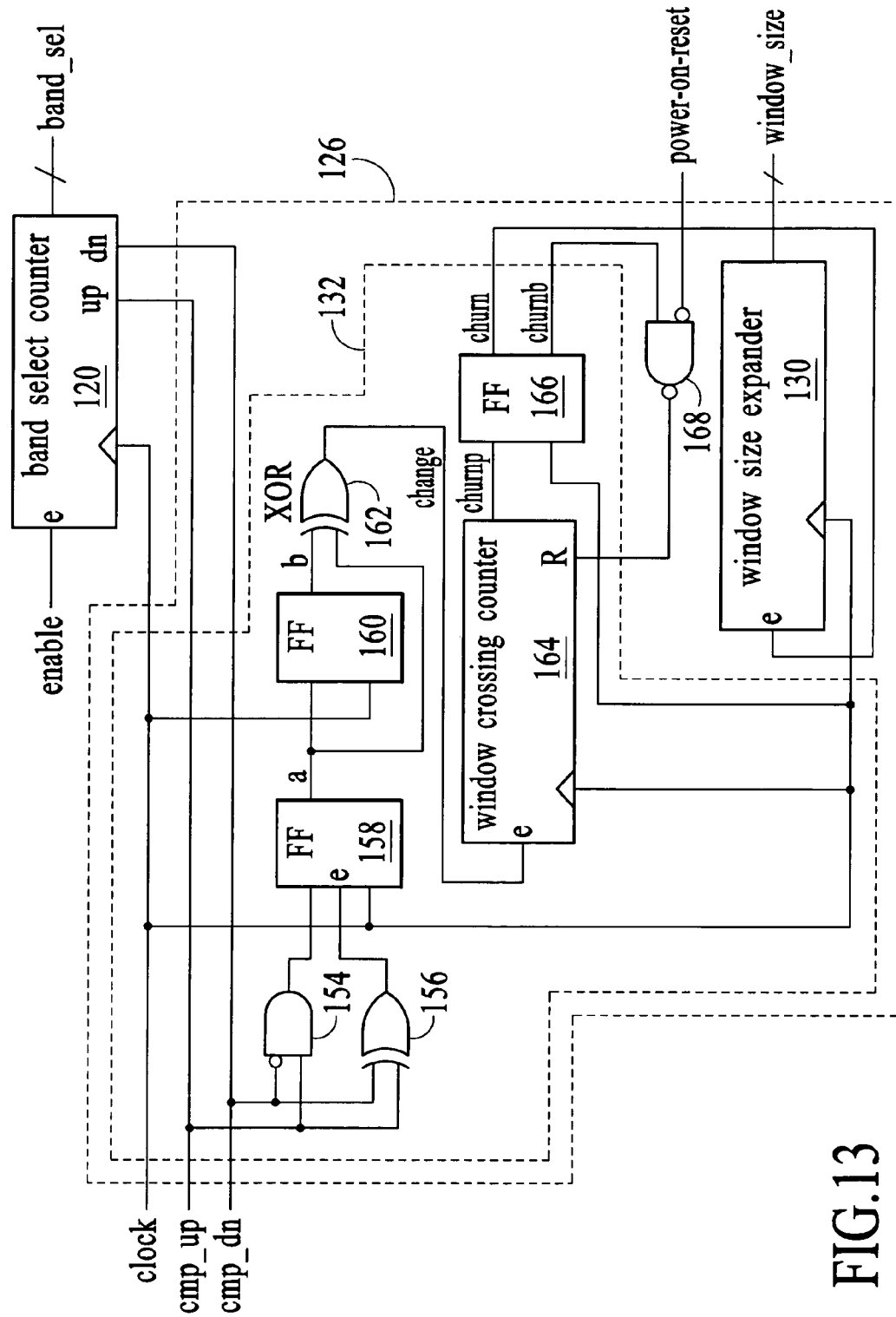
FIG. 13 depicts an expanded view of an embodiment of the window size control logic.

FIG. 13 depicts an expanded view of an embodiment of the window size control logic 126 relative to the band select counter 120. The window size control logic depicted in FIG. 13 includes the churn detector 132 and the window size expander 130. The churn detector includes AND gate 154, XOR gate 156, flip-flop (FF) 158, FF 160, XOR gate 162, a window crossing counter 164, FF 166, and AND gate 168. In operation, when the tuning signal voltage is above the tuning signal window (e.g., cmp_up=1 and cmp_dn=0, where cmp_up and cmp_dn are the output from the window comparator), the frequency band will be incremented by the band select counter 120 on the signal 'clock' when the band select counter is enabled (e.g., every 16 clocks or whenever the target frequency is reached). When the tuning signal voltage is below the tuning signal window (e.g., cmp_up=0 and cmp_dn=1), the band select counter decrements when enabled. When the tuning signal voltage is inside the tuning signal window then cmp_up=cmp_dn=0 and FF158 remains unchanged. Whenever the tuning signal voltage is outside the tuning signal window (e.g., cmp_up≠cmp_dn), FF 158 is enabled and clocks in a 1 to 'a' if cmp_up=1 or a 0 to 'a' if cmp_up=0. FF 160 passes the 'a' signal to 'b' on the next clock. As the tuning signal voltage passes from one side of the tuning signal window to the other, the tuning signal voltage will temporarily be within the tuning signal window (e.g., cmp_up=cmp_dn=0), and FF 158 is put into the hold mode, maintaining whatever data was last clocked in. When the tuning signal voltage passes out of the tuning signal window, FF 158 is enabled again and signal 'a' changes state from where it was, since it is now on the opposite side of the window. In response to the change, the XOR gate 162 sets the 'change' signal for a one clock period until the signal 'a' is passed to 'b'. The 'change' signal increments the window crossing counter 164 (that begins at 0 due to the power-on-reset signal POR that is asserted at the beginning of the cycle). Each time the tuning signal voltage crosses from one side of the tuning signal window to the other, the window crossing counter 164 increments. In the embodiment of FIG. 13, when there are four increments of the window crossing counter, the signal 'churnp' is asserted and passed to the signal 'churn' on the next clock. This resets the window crossing counter 164 and on the next clock causes the window size expander 130 to increment, thereby widening the tuning signal window by one increment. Although one embodiment of the window size control logic is described with reference to FIG. 13, other embodiments are possible.

Figure 14:
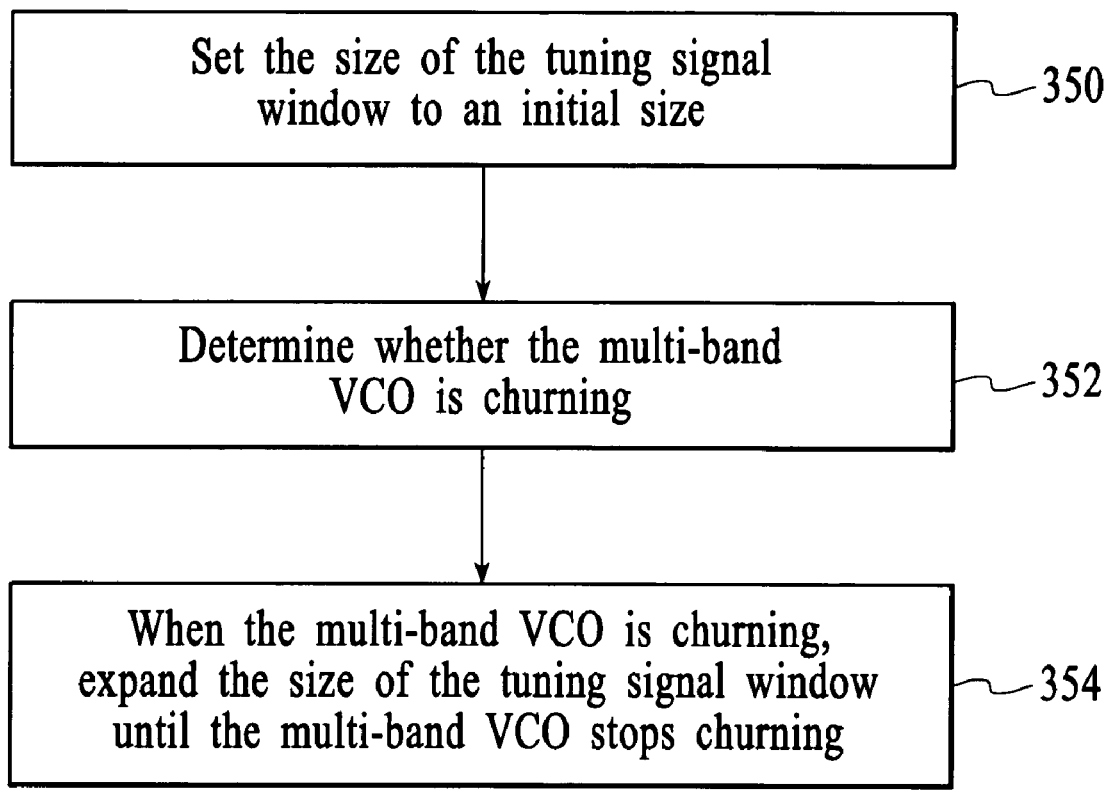
FIG. 14 is a flow diagram of a method for establishing a tuning signal window for use in centering a multi-band VCO.

FIG. 14 is a flow diagram of a method for establishing a tuning signal window for use in centering a multi-band VCO. At block 350, the size of the tuning signal window is set to an initial size. At block 352, it is determined whether the multi-band VCO is churning. At block 354, when the multi-band VCO is churning, the size of the tuning signal window is expanded until the multi-band VCO stops churning.

In the examples described above, the tuning signal window is "centered" at zero tuning voltage and expanded in equal size increments about the center until the VCO stops churning. Although centering the tuning signal window at zero tuning voltage and expanding the tuning signal window about the center works well in some cases, in other cases the frequency bands can be expected to shift either up or down during operation. For example, if the temperature of the PLL is low and the power supply is high when frequency band selection occurs, the frequency bands can be expected to shift down as the temperature increases and/or the power supply goes lower. Likewise, if the temperature is high and the power supply is low when frequency band selection occurs, the frequency bands can be expected to shift up as the temperature decreases and/or the power supply goes higher. Therefore, to compensate for the expected shifts in the frequency bands, in accordance with an embodiment of the invention, the tuning signal window is set at an offset relative to the tuning signal zero and then expanded from the offset until the VCO stops churning. The direction and magnitude of the ideal offset can be determined in different ways. Examples of setting the offset of a tuning signal window are described below with reference to FIGS. 15 and 16.

Figure 15:
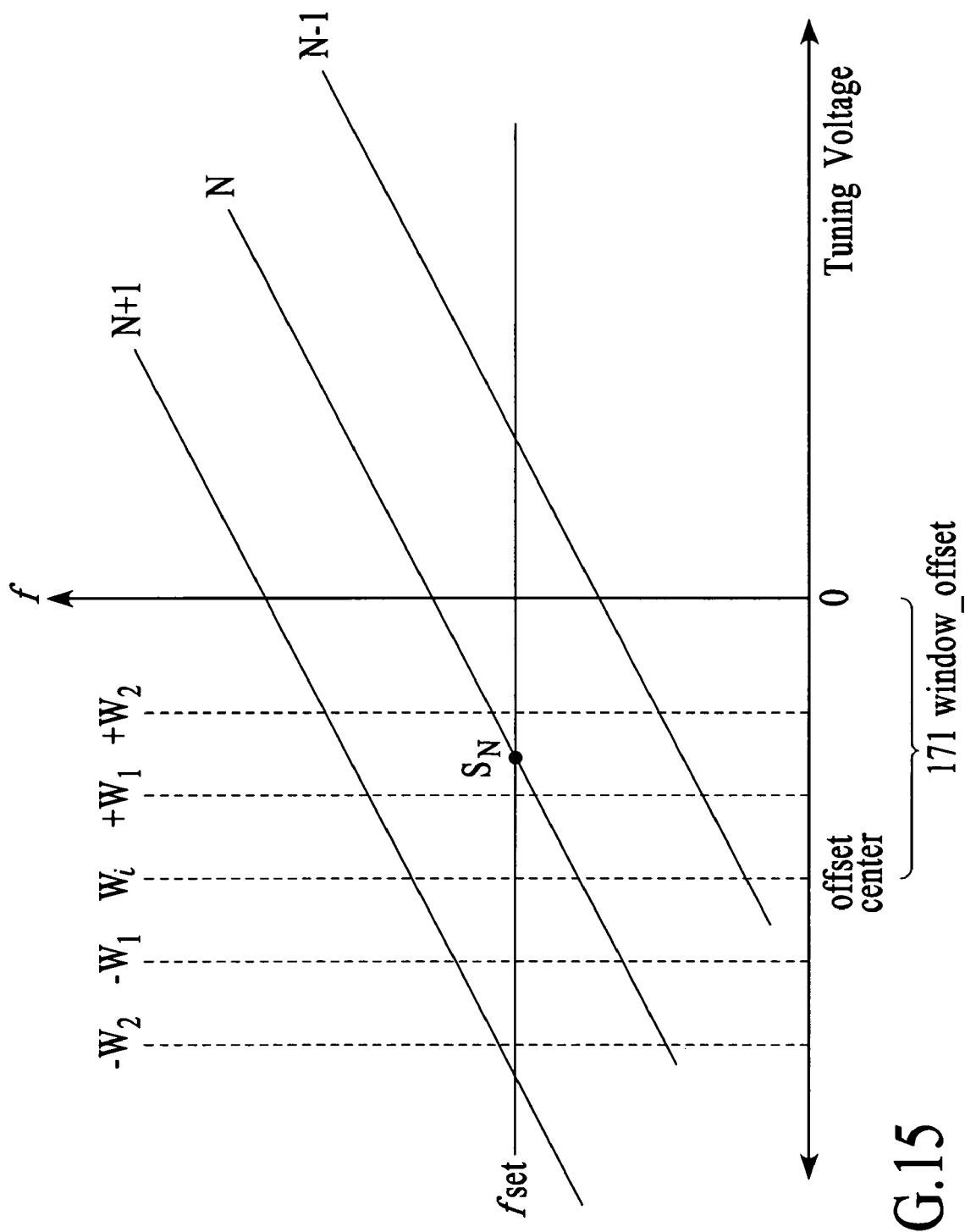
FIG. 15 depicts an example of a tuning signal window that is offset to a negative tuning signal.

In the case of an initially low temperature and high power supply, the tuning signal window is ideally offset to a negative tuning signal (e.g., shifted to the left of center) to increase the amount the frequency bands can shift down before the target frequency can no longer be reached using the selected frequency band. In particular, the offset increases the amount the frequency bands can shift down before the tuning signal voltage, pushed up as the PLL compensates to hold the VCO at the setpoint frequency, exceeds the high end of the tuning signal window. An example of a tuning signal window that is offset to a negative tuning signal is depicted in FIG. 15. In the example of FIG. 15, the tuning signal window is set at an offset that is specified by the signal window_offset 171. The initial window size ($W_i$) is zero and the tuning signal window is expanded in equal increments about the offset until a solution is incorporated into the tuning signal window. Referring to FIG. 15, the tuning signal window is expanded by a first increment from $W_i$ to $\pm W_1$, but no solution is incorporated into the tuning signal window as a result of the first incremental expansion. The tuning signal window is then expanded by a second increment from $\pm W_1$ to $\pm W_2$, at which point a solution, $S_N$, is incorporated into the tuning signal window. Setting the tuning signal window at an offset in the negative direction makes it more likely that a negative solution will found. The negative solution allows more room for the PLL to compensate for changes that cause the frequency bands to shift down.

Figure 16:
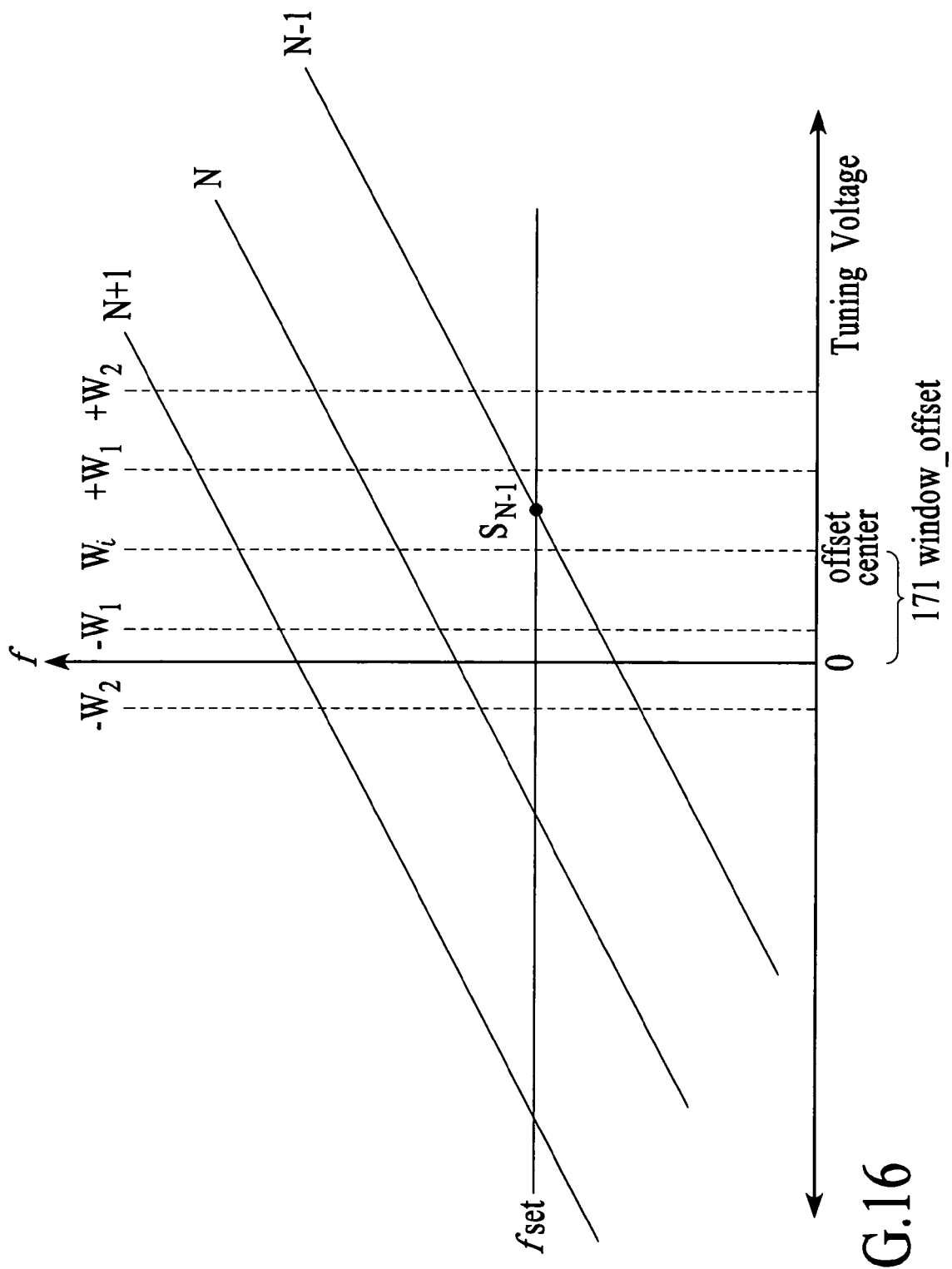
FIG. 16 depicts an example of a tuning signal window that is offset to a positive tuning signal is depicted in FIG. 16.

In the case of an initially high temperature and low power supply, the tuning signal window is ideally offset to a positive tuning signal (e.g., shifted to the right of center) so as to increase the amount the frequency bands can shift up before the target frequency can no longer be reached using the selected frequency band. In particular, the offset increases the amount the frequency bands can shift up before the tuning signal voltage, pushed down as the PLL compensates to hold the VCO at the setpoint frequency, drops below the low end of the tuning signal window. An example of a tuning signal window that is offset to a positive tuning signal is depicted in FIG. 16. In the example of FIG. 16, the tuning signal window is set at an offset that is specified by the signal window_offset 171. The initial window size ($W_i$) is zero and the tuning signal window is expanded in equal increments about the offset until a solution is incorporated into the tuning signal window. Referring to FIG. 16, the tuning signal window is expanded by a first increment from $W_i$ to $\pm W_1$, but no solution is incorporated into the tuning signal window as a result of the first incremental expansion. The tuning signal window is then expanded by a second increment from $\pm W_1$ to $\pm W_2$, at which point a solution, $S_{N-1}$, is incorporated into the tuning signal window. Setting the tuning signal window at an offset in the positive direction makes it more likely that a positive solution will found. The positive solution allows more room for the PLL to compensate for changes that cause the frequency bands to shift up.

Figure 17:
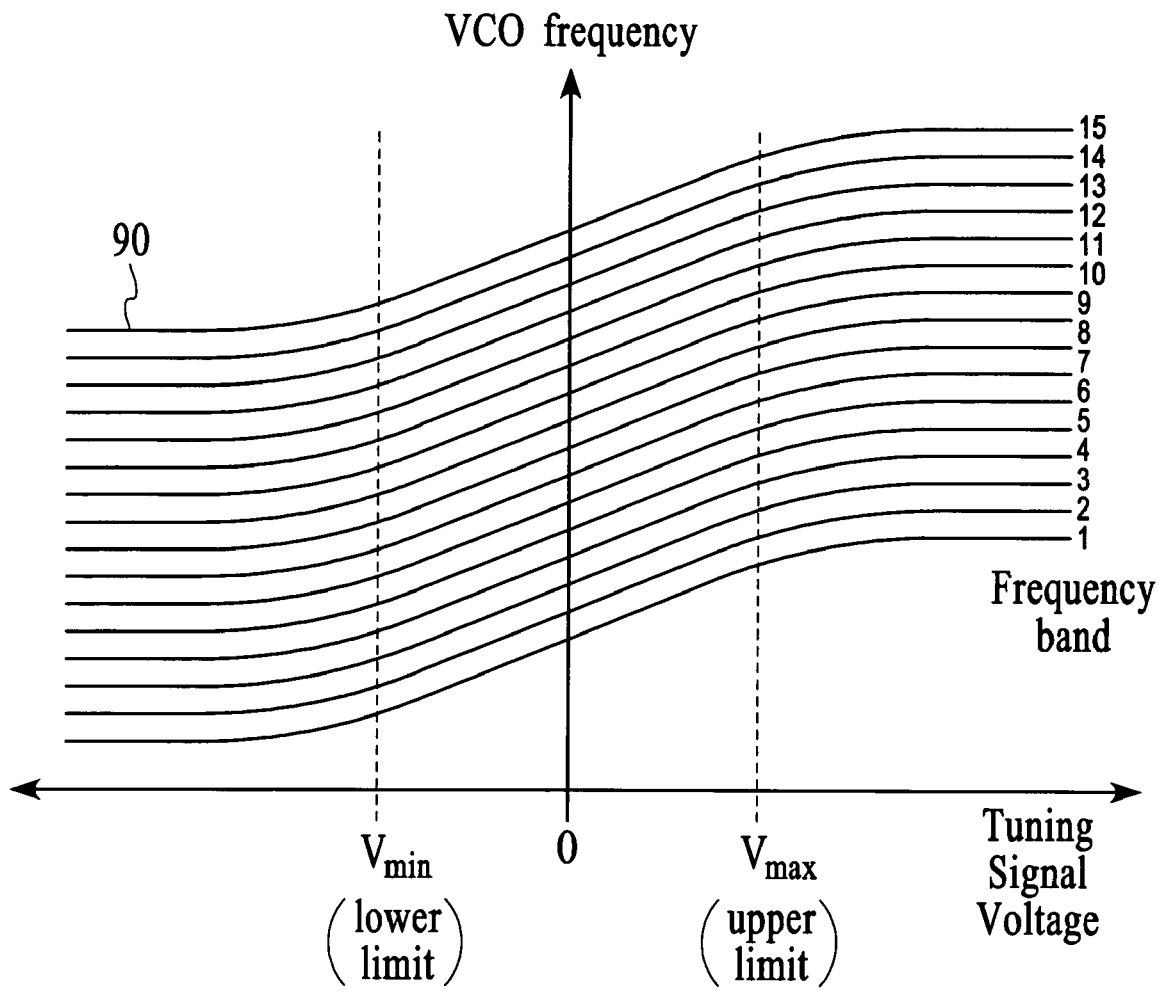
FIG. 17 is a graph of frequency bands of a multi-band VCO that identifies upper and lower limits for the tuning signal.

In another embodiment of the invention, upper and lower limits are established for the upper and lower boundaries of the tuning signal window. The upper and lower limits are established to prevent the system from finding a solution that is too close to the edge of the frequency bands, where the slope rolls off (i.e., the saturating portions of the frequency bands). FIG. 17 is a graph of frequency bands of a multi-band VCO that identifies upper and lower limits ($V_{max}$ and $V_{min}$, respectively) for the tuning signal.

Figure 18:
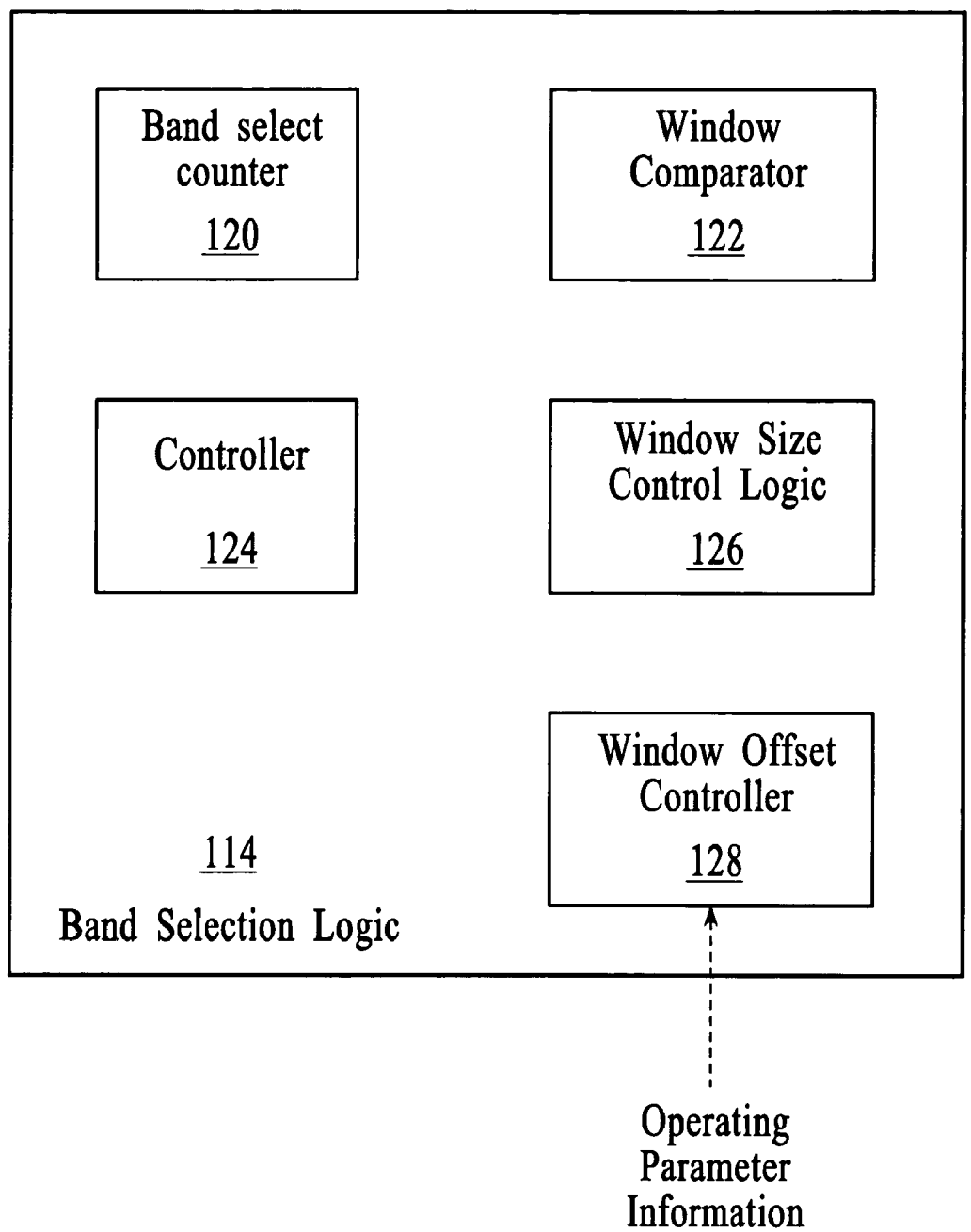
FIG. 18 depicts an expanded view of band selection logic that is configured to offset the tuning signal window.

FIG. 18 depicts an expanded view of band selection logic 114 that is configured to offset the tuning signal window. The band selection logic includes a band select counter 120, a window comparator 122, a controller 124, window size control logic 126, and a window offset controller 128. The band select counter, window comparator, controller, and window size control logic are similar to those described above with reference to FIG. 3. The window offset controller is configured to set the offset of the tuning signal window. In an embodiment, the offset of the tuning signal window is set in response to an operating parameter or parameters. Operating parameters that may affect the magnitude and direction of the offset include, for example, operating temperature, the power supply, and the age of the PLL. The window offset controller can be configured to communicate offset information to the window size control logic or to the window comparator.

Figure 19:
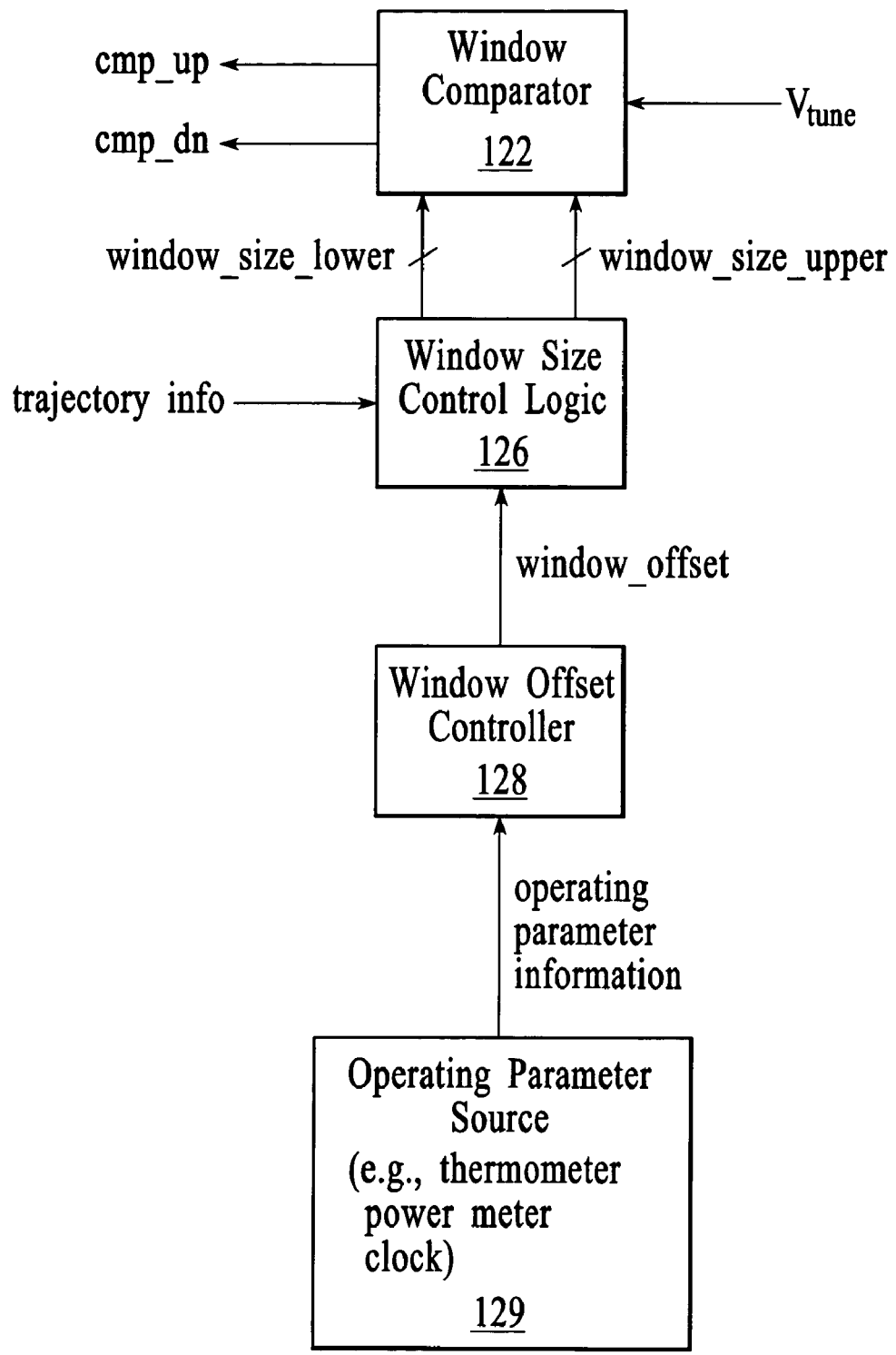
FIG. 19 is a functional depiction of the window comparator, the window size control logic, the window offset controller, and an operating parameter source.

FIG. 19 is a functional depiction of the window comparator 122, the window size control logic 126, the window offset controller 128, and an operating parameter source 129. The operating parameter source can be an element such as a thermometer, a power meter, or a clock, that provides operating parameter information to the window offset controller. The window offset controller uses the operating parameter information to determine the desired offset of the tuning signal window (e.g., as window_offset). The offset is provided to the window size control logic and used to set the center of the tuning signal window. In an alternative embodiment, the offset can be set in response to an input that is not an operating parameter. For example, the offset can be set in response to a user input value.

The window size control logic 126 and window comparator 122 depicted in FIG. 19 are configured such that the upper and lower boundaries of the tuning signal window are individually adjustable. In an embodiment, the window comparator is configured with two separate DACs that control the upper (positive) and lower (negative) boundaries of the tuning signal window. The upper and lower boundaries of the tuning signal window are set in response to the signals window_size_upper and window_size_lower, respectively, which are received from the window size control logic.

Figure 20:
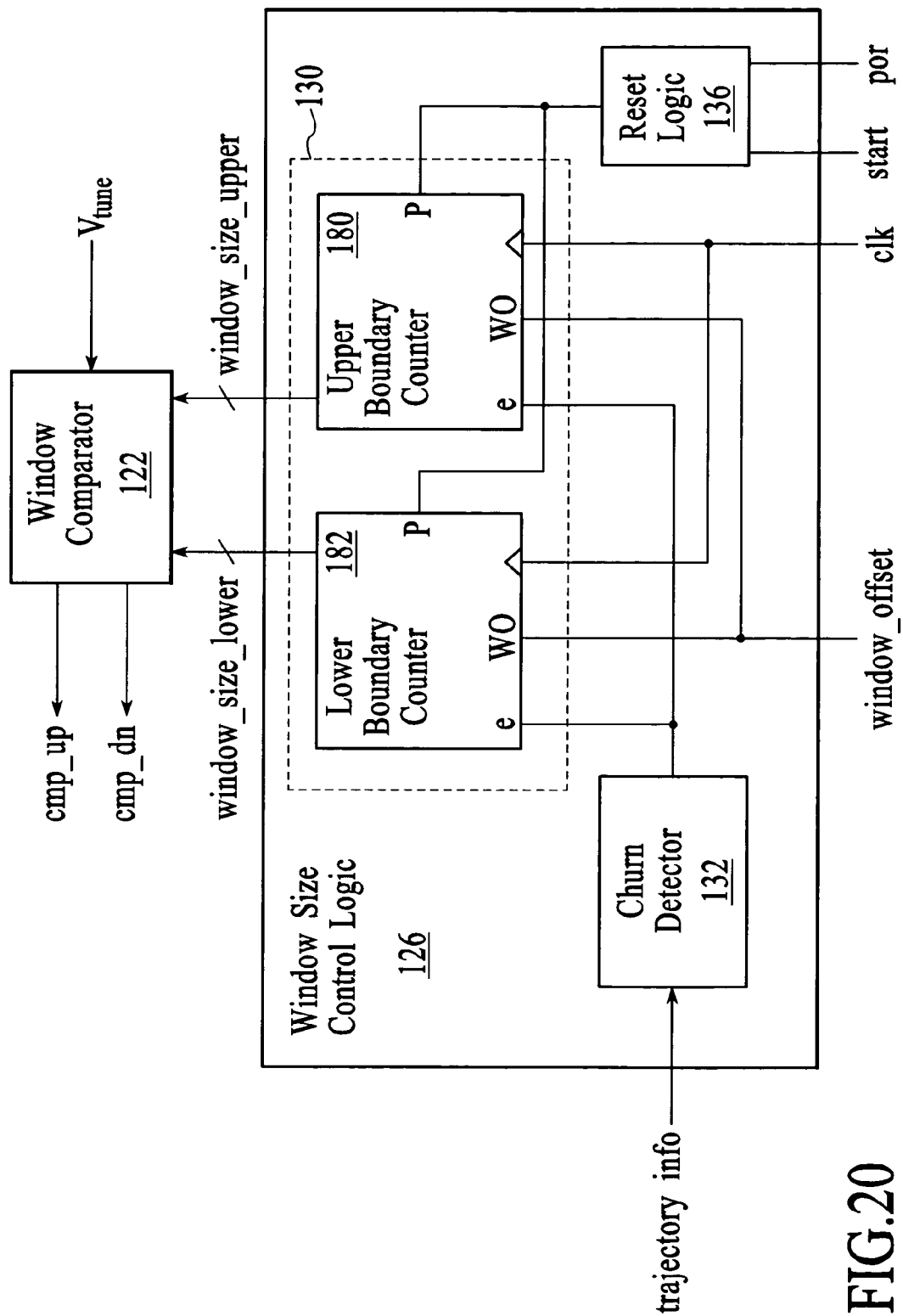
FIG. 20 is a depiction of an embodiment of the window size control logic from FIG. 19 that is configured to set the offset of the tuning signal window and to independently adjust the upper and lower boundaries of the tuning signal window.

FIG. 20 is a depiction of an embodiment of the window size control logic 126 from FIG. 19 that is configured to set the offset of the tuning signal window and to independently adjust the upper and lower boundaries of the tuning signal window. The window size control logic includes a churn detector 132 and reset logic 136 as described above with reference to FIG. 8. In the embodiment of FIG. 20, the window size expander 130 includes an upper boundary counter 180 and a lower boundary counter 182. The upper boundary counter counts up in response to the enable signal from the churn detector and the lower boundary counter counts down in response to the enable signal from the churn detector. In operation, the offset of the tuning signal window is represented by the signal window_offset and the counters of the window size expander are set to the value window_offset in response to the reset signal from the reset logic. In the embodiment of FIG. 20, the initial window size is zero because both counters are set to the same value (e.g., window_offset). The upper and lower boundary counters are then changed (incremented and decremented, respectively) in response to the enable signal from the churn detector. In an embodiment, the upper boundary counter is configured with a maximum value that corresponds to the upper boundary limit of the tuning signal window and the lower boundary counter is configured with a minimum value that corresponds to the lower boundary limit of the tuning signal window. The tuning signal window is not allowed to expand beyond either of the two boundary limits. As described above with reference to FIGS. 2–14, the tuning signal window is incrementally expanded until the VCO stops churning. Once the VCO stops churning, the tuning signal window is maintained at the current size until a reset event causes the tuning signal window to be set back to its initial size (i.e., its preset value).

Although specific embodiments in accordance with the invention have been described and illustrated, the invention is not limited to the specific forms and arrangements of parts so described and illustrated. The invention is limited only by the claims.

What is claimed is:

1. A method for establishing a tuning signal window for use in centering a multi-band voltage controlled oscillator (VCO), the method comprising:
    setting the size of the tuning signal window to an initial size;
    determining whether the multi-band VCO is churning; and
    when the multi-band VCO is churning, expanding the size of the tuning signal window until the multi-band VCO stops churning.

2. The method of claim 1 wherein the initial size of the tuning signal window is zero.

3. The method of claim 1 wherein the size of the tuning signal window is set by a count and wherein expanding the size of the tuning signal window comprises incrementing the count.

4. The method of claim 1 wherein expanding the size of the tuning signal window comprises incrementally expanding the tuning signal window.

5. The method of claim 1 wherein the determining comprises tracking tuning signal window crossings by the VCO.

6. The method of claim 1 wherein the determining comprises tracking frequency band changes.

7. The method of claim 1 further comprising selecting a frequency band that corresponds to a solution and maintaining the selected frequency band.

8. The method of claim 7 further comprising setting the tuning signal window to the initial size in response to a reset event.

9. The method of claim 8 wherein a reset event includes one of a loss of frequency lock and a system restart.

10. The method of claim 1 further comprising offsetting the tuning signal window relative to a zero tuning signal.

11. The method of claim 10 wherein offsetting the tuning signal window comprises determining a window offset as a function of an operating parameter.

12. The method of claim 10 wherein setting the tuning signal window at an offset comprises determining the window offset as a function of an operating temperature related to the VCO.

13. The method of claim 10 wherein expanding the size of the tuning signal window comprises expanding the size of the tuning signal window from the offset.

14. The method of claim 10 wherein expanding the size of the tuning signal window comprises expanding the size of the tuning signal window in equal increments on either side of the offset.

15. The method of claim 10 wherein expanding the size of the tuning signal window comprises individually expanding upper and lower boundaries of the tuning signal window.

16. The method of claim 1 further comprising establishing upper and lower limits for upper and lower boundaries of the tuning signal window and preventing the tuning signal window from being expanded beyond the upper and lower limits.

17. A system for establishing a tuning signal window for use in centering a multi-band voltage controlled oscillator (VCO), the system comprising:
a churn detector configured to determine whether the multi-band VCO is churning and to generate a churning indicator signal when the multi-band VCO is determined to be churning; and
a window size expander configured to expand the size of the tuning signal window in response to the churning indicator signal from the churn detector.

18. The system of claim 17 wherein the window size expander includes a size indicator, the system further comprising reset logic configured to set the size indicator of the window size expander to an initial size.

19. The system of claim 18 wherein the reset logic is configured to set the size indicator of the window size expander to the initial size in response to one of a loss of frequency lock or a system restart.

20. The system of claim 17 wherein the window size expander is configured to incrementally expand the size of the tuning signal window in response to the churning indicator signal from the churn detector.

21. The system of claim 17 wherein the window size expander comprises a digital counter that is incremented by one increment in response to the churning indicator signal.

22. The system of claim 17 wherein the window size expander comprises a counter that is reset to an initial size in response to a reset signal.

23. The system of claim 17 wherein the churn detector is configured to track tuning signal window crossings to determine churning.

24. The system of claim 17 wherein the churn detector is configured to track frequency band changes to determine churning.

25. The system of claim 17 further comprising a window offset controller configured to establish the tuning signal window at an offset relative to a zero tuning signal.

26. The system of claim 25 wherein the window offset controller is configured to determine the window offset as a function of an operating parameter.

27. The system of claim 25 wherein the window offset controller is configured to determine the window offset as a function of an operating temperature related to the VCO.

28. The system of claim 25 wherein the window size expander is configured to expand the size of the tuning signal window from the offset.

29. The system of claim 25 wherein the window size expander is configured to expand the size of the tuning signal window in equal increments on either side of the offset.

30. The system of claim 25 wherein the window size expander comprises an upper boundary counter and a lower boundary counter configured to individually expand upper and lower boundaries of the tuning signal window.

31. The system of claim 25 wherein the window size expander comprises an upper boundary counter that is configured with an upper boundary limit and a lower boundary counter that is configured with a lower boundary limit.

32. A system for centering a multi-band voltage controlled oscillator (VCO), the system comprising:
a band select counter configured to generate a band select signal for selecting a frequency band of the multi-band VCO;
a window comparator in signal communication with said band select counter configured to compare a tuning signal to a tuning signal window and to output a comparison signal that allows the band select signal to be changed only when the tuning signal is outside the tuning signal window; and
window size control logic comprising;
a churn detector configured to determine whether the multi-band VCO is churning and to generate a churning indicator signal when the multi-band VCO is determined to be churning; and
a window size expander configured to expand the size of the tuning signal window in response to the churning indicator signal from the churn detector.

33. The system of claim 32 wherein the window size expander includes a size indicator, the window size control logic further comprising reset logic configured to set the size indicator of the window size expander to an initial size.

34. The system of claim 33 further including a controller configured to allow the band select signal to change N times after lock is achieved.

35. The system of claim 32 further comprising a window offset controller configured to establish the tuning signal window at an offset relative to a zero tuning signal.

* * * * *